(12) United States Patent
Agarwal et al.

(10) Patent No.: US 9,444,003 B2
(45) Date of Patent: Sep. 13, 2016

(54) LAYER-BY-LAYER NANOASSEMBLED NANOPARTICLES BASED THIN FILMS FOR SOLAR CELL AND OTHER APPLICATIONS

(75) Inventors: Mangilal Agarwal, Indianapolis, IN (US); Khodadad Varahramyan, Indianapolis, IN (US); Sudhir Shrestha, Indianapolis, IN (US)

(73) Assignee: Indiana University Research and Technology Corporation, Indianapolis, IN (US)

( * ) Notice: Subject to any disclaimer, the term of this patent is extended or adjusted under 35 U.S.C. 154(b) by 693 days.

(21) Appl. No.: 13/812,449

(22) PCT Filed: Jul. 27, 2011

(86) PCT No.: PCT/US2011/045632
§ 371 (c)(1),
(2), (4) Date: Jan. 25, 2013

(87) PCT Pub. No.: WO2012/015989
PCT Pub. Date: Feb. 2, 2012

(65) Prior Publication Data
US 2013/0112263 A1 May 9, 2013

Related U.S. Application Data

(60) Provisional application No. 61/368,243, filed on Jul. 27, 2010.

(51) Int. Cl.
*H01L 31/0304* (2006.01)
*H01L 31/18* (2006.01)
(Continued)

(52) U.S. Cl.
CPC .......... *H01L 31/18* (2013.01); *H01L 31/0296* (2013.01); *H01L 31/022483* (2013.01);
(Continued)

(58) Field of Classification Search
CPC ............... H01L 31/18; H01L 31/0322; H01L 31/0296; H01L 31/022483; H01L 31/035281; H01L 31/0392; H01L 31/20; H01L 31/0749
USPC ........................................................ 136/265
See application file for complete search history.

(56) References Cited

U.S. PATENT DOCUMENTS

| | | | |
|---|---|---|---|
| 7,053,294 B2 | 5/2006 | Tuttle et al. | |
| 7,858,151 B2 * | 12/2010 | Sager .................... | C23C 16/405 427/248.1 |

(Continued)

FOREIGN PATENT DOCUMENTS

| | | | |
|---|---|---|---|
| EP | 2040304 | | 3/2009 |
| FR | WO 2009/056732 | * | 5/2009 |

OTHER PUBLICATIONS

Sukhorukov et al., Layer-by-layer self assembly of polyelectrolytes on colloidal particles, Colloids and Surfacec A: Physicochemical and Engineering Aspects, vol./issue 137, pp. 253-266 (1998).*

(Continued)

*Primary Examiner* — Jayne Mershon
(74) *Attorney, Agent, or Firm* — Ice Miller LLP

(57) ABSTRACT

A solar cell. The solar cell includes a substrate, a first layer comprising a first copper-based material deposited upon the substrate, the first copper-based material electrically attracted to the substrate or to a first optional deposit layer deposited between the substrate and the first layer, and a second layer comprising a second copper-based material deposited upon the first layer or an second optional deposit layer deposited between the first layer and the second layer, the second copper-based material electrically attracted to the first layer or to the second optional deposit layer, wherein the first copper-based material and the second copper-based material are selected from the group consisting of copper indium gallium (di)selenide (CIGS), copper indium selenium (CIS), and cadmium sulfate (CdS).

61 Claims, 13 Drawing Sheets

(51) Int. Cl.
*H01L 31/0296* (2006.01)
*H01L 31/032* (2006.01)
*H01L 31/0352* (2006.01)
*H01L 31/0392* (2006.01)
*H01L 31/0749* (2012.01)
*H01L 31/20* (2006.01)
*H01L 31/0224* (2006.01)

(52) U.S. Cl.
CPC ....... *H01L31/0322* (2013.01); *H01L 31/0392* (2013.01); *H01L 31/035281* (2013.01); *H01L 31/0749* (2013.01); *H01L 31/20* (2013.01); *Y02E 10/541* (2013.01); *Y02P 70/521* (2015.11)

(56) References Cited

U.S. PATENT DOCUMENTS

2010/0084014 A1    4/2010  Roscheisen et al.
2010/0282301 A1*   11/2010 Peter .................. C03C 17/3435
                                                      136/252
2011/0030768 A1*   2/2011  Fujdala et al. ................ 136/252

OTHER PUBLICATIONS

International Searching Authority, International Search Report, mailed Mar. 15, 2012 (PCT/2011/045632).

International Searching Authority, Written Opinion of the International Searching Authority, mailed Mar. 15, 2012 (PCT/2011/045632).

* cited by examiner

LAYER-BY-LAYER NANOASSEMBLED NANOPARTICLES BASED THIN FILMS FOR SOLAR CELL AND OTHER APPLICATIONS

PRIORITY

The present application is related to, claims the priority benefit of, and is a U.S. §371 national stage entry of, International Patent Application Ser. No. PCT/US2011/045632, filed Jul. 27, 2011, which is related to, and claims the priority benefit of, U.S. Provisional Patent Application Ser. No. 61/368,243, filed Jul. 27, 2010. The contents of each of these applications are hereby incorporated by reference in their entirety into this disclosure.

TECHNICAL FIELD

The present disclosure generally relates to nano-particle structures and particularly to thin films constructed of nano-particles using a Layer-by-Layer (LBL) nanoassembly method for developing solar cells and alike.

BACKGROUND

The area of nanoparticles and nanostructures made from nanoparticles has grown over the last few years. Examples of structures made from nano-particles include new batteries and supercapacitors which include a baseline structure made from nanoparticles.

Typically, nanoparticles are formed on a substrate by one or more methods of deposition. For example, physical vapor deposition by sputtering is one such method where a plasma discharge assails a substrate or alike to form a layer of nanoparticles on the substrate. However, these methods of deposition are limited to substrates with planar structures. Therefore, there is a need for forming nanoparticles on substrates that do not have planar structures.

In addition, development of high efficiency and long life thin film solar cell has been ongoing. Copper indium selenium (CIS) and copper indium gallium selenium (CIGS) are semiconductor materials which posses wide band gap range as compared to other semiconductor materials, e.g., silicon. Silicon is the most widely used solar cell material which has a band gap of about 1.1 eV. The optimum band gap for highest efficiency solar cell is about 1.5 eV. Thus, alternative materials such as copper indium gallium selenium (CIGS) have recently attracted more attention. CIGS has a tunable band gap range of between 1.04 eV to 1.67 eV. The band gap of CIGS is manipulated by changing the ratio of indium and gallium. CIGS solar cell with the CIGS film thickness less than 1 micrometer has been demonstrated compared to few micrometer silicon thickness requirements with silicon-based solar cells. The wide band gap ranges lead to high efficiency by converting more energy of incoming photons into electrical energy and producing less thermal dissipation energy.

Additionally, CIS-based solar cells have generally been fabricated by co-evaporation of individual elements. More recently, various cost-effective non-vacuum based fabrication methods of CIS-based solar cells have been developed. Furthermore, CIS and CIGS nanoparticles have been used to develop "ink" which is further utilized to fabricate solar cells by various printing techniques.

These printing techniques provide solar cells on both rigid and flexible substrates. However, printing on a non-planar substrate is both expensive and difficult. In addition, the CIS or CIGS solar cells developed thus far, are not commercially viable for household and other consumer based applications, mostly because of high cost-per-unit-power (i.e., cost of manufacturing per unit energy produced). Therefore, a scalable solution is needed that makes solar cell technology affordable for everyday use.

SUMMARY

In at least one embodiment of a solar cell of the present disclosure, the solar cell comprises a substrate, a first layer comprising a first copper-based material deposited upon the substrate, the first copper-based material electrically attracted to the substrate or to a first optional deposit layer deposited between the substrate and the first layer, and a second layer comprising a second copper-based material deposited upon the first layer or an second optional deposit layer deposited between the first layer and the second layer, the second copper-based material electrically attracted to the first layer or to the second optional deposit layer, wherein the first copper-based material and the second copper-based material are selected from the group consisting of copper indium gallium (di)selenide (CIGS), copper indium selenium (CIS), and cadmium sulfate (CdS). In another embodiment, the first copper-based material is different from the second copper-based material. In yet another embodiment, the first copper-based material comprises CIS and the second copper-based material comprises CIGS. In an additional embodiment, the first copper-based material comprises CIGS, and wherein the second copper-based material comprises CIS.

In at least one embodiment of a solar cell of the present disclosure, the first copper-based material and the second copper-based material comprise the same material, and the solar cell comprises the second optional deposit layer. In an additional embodiment, the first copper-based material and the second copper-based material each comprise CIS. In yet an additional embodiment, the first copper-based material and the second copper-based material each comprise CIGS. In another embodiment, the second optional deposit layer comprises a deposit layer comprising a material selected from the group consisting of a poly-allylamine hydrochlodride, poly-(sodium-4-styrene sulfonate, polyethylenimine, diallyldimethylammonium chloride, and acrylic acid. In yet another embodiment, the first layer and the second layer together have a thickness of less than 500 nm.

In at least one embodiment of a solar cell of the present disclosure, the substrate comprises a negatively-charged surface. In another embodiment, the negatively-charged substrate surface has a deposit of poly-allylamine hydrochlodride thereon, whereby the first layer is deposited upon the substrate upon the deposit of poly-allylamine hydrochlodride. In yet another embodiment, the first copper-based material comprises nanoparticles having a negative surface charge, and the second copper-based material comprises nanoparticles having a positive surface charge. In an additional embodiment, the negatively-charged substrate surface has a deposit of poly-allylamine hydrochlodride thereon, and the deposit of poly-allylamine hydrochlodride has a deposit of poly-(sodium-4-styrene sulfonate) thereon, whereby the first layer is deposited upon the substrate upon the deposit of poly-(sodium-4-styrene sulfonate). In yet an additional embodiment, the first copper-based material comprises nanoparticles having a positive surface charge, and the second copper-based material comprises nanoparticles having a negative surface charge.

In at least one embodiment of a solar cell of the present disclosure, the first copper-based material is combined with poly-allylamine hydrochlodride to facilitate deposition of the first copper-based material on the substrate. In an additional embodiment, the second copper-based material is combined with poly-(sodium-4-styrene sulfonate) to facilitate deposition of the second copper-based material on the first layer comprising the first copper-based material. In yet an additional embodiment, the solar cell further comprises a third layer comprising the first copper-based material or the second copper-based material deposited upon the second layer or an third optional deposit layer deposited upon the second layer. In another embodiment, the solar cell further comprises a fourth layer comprising the first copper-based material or the second copper-based material deposited upon the third layer or an fourth optional deposit layer deposited upon the third layer. In yet another embodiment, the solar cell further comprises additional alternating layers of the first copper-based material and/or the second copper-based material deposited upon the fourth layer.

In at least one embodiment of a solar cell of the present disclosure, the first copper-based material is combined with poly-(sodium-4-styrene sulfonate) to facilitate deposition of the first copper-based material on the substrate. In another embodiment, the second copper-based material is combined with poly-allylamine hydrochlodride to facilitate deposition of the second copper-based material on the first layer. In yet another embodiment, the solar cell further comprises a third layer comprising the first copper-based material deposited upon the second layer. In an additional embodiment, the solar cell further comprises a fourth layer comprising the second copper-based material deposited upon the third layer. In yet an additional embodiment, the solar cell further comprises additional alternating layers of one or more of the first copper-based material and the second copper-based material deposited upon the fourth layer. In another embodiment, the solar cell further comprises additional layers of one or more of the first copper-based material and the second copper-based material deposited upon the second layer or upon one or more additional deposit layers upon the second layer.

In at least one embodiment of a solar cell of the present disclosure, the solar cell further comprises a cadmium-based layer comprising a cadmium-based material deposited upon a last layer of a copper-based material, the last layer comprising the second layer or a last deposited layer comprising a copper-based material. In another embodiment, the solar cell further comprises a first zinc oxide layer comprising a first zinc oxide material deposited upon the cadmium-based layer In yet another embodiment, the solar cell further comprises a second zinc oxide layer comprising a second zinc oxide material deposited upon the first zinc oxide layer, the second zinc oxide material different than the first zinc oxide material. In an additional embodiment, the cadmium-based material, the first zinc oxide material, and the second zinc oxide material form top conductors of the solar cell. In yet an additional embodiment, the cadmium-based layer has a thickness of about 50 nm. In even an additional embodiment, the cadmium-based material comprises cadmium sulfide.

In at least one embodiment of a solar cell of the present disclosure, the first zinc oxide layer has a thickness between about 80 nm and about 120 nm. In an additional embodiment, the first zinc oxide material comprises intrinsic zinc oxide. In yet an additional embodiment, the second zinc oxide layer has a thickness between about 100 nm and about 140 nm. In another embodiment, the second zinc oxide material comprises n-type zinc oxide. In yet another embodiment, the substrate is selected from the group consisting of an indium tin oxide coated glass substrate, a copper substrate, and a copper-coated substrate.

In at least one embodiment of a solar cell of the present disclosure, the solar cell further comprises the second optional deposit layer deposited between the first layer and the second layer, the second optional deposit layer comprising poly-allylamine hydrochlodride. In another embodiment, the second copper-based material is combined with poly-(sodium-4-styrene sulfonate) to facilitate deposition of the second copper-based material on the second optional deposit layer. In yet another embodiment, additional alternating deposits of poly-allylamine hydrochlodride and additional layers of one or more of the first copper-based material or the second copper-based material are deposited above the second layer. In an additional embodiment, the first copper material is combined with poly-(sodium-4-styrene sulfonate), and the second copper material is first combined with poly-(sodium-4-styrene sulfonate) and later combined with poly-allylamine hydrochlodride. In yet an additional embodiment, additional alternating layers of the first copper material and the second copper material are deposited above the second layer.

In at least one embodiment of a solar cell of the present disclosure, the substrate is selected from the group consisting of a planar substrate, a non-planar substrate, and a nano-planar substrate. In an additional embodiment, the first copper-based material is combined with poly-(sodium-4-styrene sulfonate) in an aqueous solution to facilitate deposition of the first copper-based material on the substrate. In yet an additional embodiment, the second copper-based material is combined with poly-allylamine hydrochlodride in an aqueous solution to facilitate deposition of the second copper-based material on the first layer. In another embodiment, the solar cell further comprises a cadmium-based layer comprising a cadmium-based material deposited upon a last layer of a copper-based material, the last layer comprising the last deposited layer comprising a copper-based material. In yet another embodiment, the solar cell further comprises a first zinc oxide layer comprising a first zinc oxide material deposited upon the cadmium-based layer. In an additional embodiment, the solar cell further comprises a second zinc oxide layer comprising a second zinc oxide material deposited upon the first zinc oxide layer, the second zinc oxide material different than the first zinc oxide material.

In at least one embodiment of a solar cell of the present disclosure, the substrate comprises a layer of poly(3,4-ethylenedioxythiophene) thereon. In another embodiment, the solar cell comprises the first optional deposit layer, the first optional deposit layer comprising poly(3,4-ethylenedioxythiophene). In yet another embodiment, the first copper-based material and the second copper-based material each comprise CIGS. In an additional embodiment, the first copper-based material is dispersed in one or both of isopropyl alcohol and an aqueous solution. In yet an additional embodiment, the solar cell further comprises a second substrate comprising a layer of a zinc material deposited thereon, the second substrate positioned upon an uppermost layer of either the first copper-based material or the second copper-based material.

In at least one embodiment of a solar cell of the present disclosure, the substrate comprises a layer of indium tin dioxide thereon. In an additional embodiment, the solar cell comprises the first optional deposit layer, the first optional deposit layer comprising indium tin dioxide. In yet an additional embodiment, the first copper-based material comprises CdS and wherein the second copper-based material comprises CIGS. In another embodiment, the solar cell further comprises a second substrate, wherein the second substrate comprises the second layer deposited thereon, and wherein the second substrate comprising the second layer is positioned upon the first layer. In yet another embodiment, the second substrate comprises a layer of indium tin dioxide thereon, and wherein the layer of indium tin dioxide is present upon the second substrate prior to the second layer being deposited thereon. In an additional embodiment, the solar cell further comprises a second substrate positioned upon the second zinc oxide layer.

In at least one embodiment of a solar cell of the present disclosure, the solar cell comprises a substrate, a first layer comprising a first copper-based material deposited upon the substrate, the first copper-based material electrically attracted to the substrate or to a first optional deposit layer deposited between the substrate and the first layer, and a second layer comprising a second copper-based material deposited upon the first layer or an second optional deposit layer deposited between the first layer and the second layer, the second copper-based material electrically attracted to the first layer or to the second optional deposit layer. In another embodiment, the solar cell comprises the second optional deposit layer, the first copper-based material and the second copper-based material are selected from the group consisting of copper indium gallium (di)selenide (CIGS), copper indium selenium (CIS), and cadmium sulfate (CdS), and the second optional deposit layer comprises a deposit layer comprising a material selected from the group consisting of a poly-allylamine hydrochlodride, poly-(sodium-4-styrene sulfonate, polyethylenimine, diallyldimethylammonium chloride, and acrylic acid.

In at least one embodiment of a solar cell of the present disclosure, the solar cell comprises a substrate, a first layer comprising a first copper-based material deposited upon the substrate, the first copper-based material electrically attracted to the substrate or to a first optional deposit layer deposited between the substrate and the first layer, and a second layer comprising a second copper-based material deposited upon the first layer or an second optional deposit layer deposited between the first layer and the second layer, the second copper-based material electrically attracted to the first layer or to the second optional deposit layer, a cadmium-based layer comprising a cadmium-based material deposited upon a last layer of a copper-based material, the last layer comprising the second layer or a last deposited layer comprising a copper-based material, a first zinc oxide layer comprising a first zinc oxide material deposited upon the cadmium-based layer, and a second zinc oxide layer comprising a second zinc oxide material deposited upon the first zinc oxide layer, the second zinc oxide material different than the first zinc oxide material, wherein the first copper-based material and the second copper-based material are selected from the group consisting of copper indium gallium (di)selenide (CIGS), copper indium selenium (CIS), and cadmium sulfate (CdS).

In at least one embodiment of a method of preparing a solar cell of the present disclosure, the method comprises the steps of depositing a first layer comprising a first copper-based material upon a substrate, the first copper-based material electrically attracted to the substrate or to a first optional deposit layer deposited between the substrate and the first layer, and depositing a second layer comprising a second copper-based material upon the first layer or an second optional deposit layer deposited between the first layer and the second layer, the second copper-based material electrically attracted to the first layer or to the second optional deposit layer, wherein the first copper-based material and the second copper-based material are selected from the group consisting of copper indium gallium (di)selenide (CIGS), copper indium selenium (CIS), and cadmium sulfate (CdS). In another embodiment, the method further comprises the step of depositing one or more additional material layers upon the second layer or an third optional deposit layer positioned thereon to form a solar cell. In yet another embodiment, the step of depositing a second layer comprises depositing a second layer comprising a second copper-based material that is different from the first copper-based material. In an additional embodiment, the step of depositing a first layer comprising a first copper-based material comprises depositing a first layer comprising CIS, and the step of depositing a second layer comprises depositing a second layer comprising CIGS. In yet an additional embodiment, the step of depositing a first layer comprising a first copper-based material comprises depositing a first layer comprising CIGS, and the step of depositing a second layer comprises depositing a second layer comprising CIS.

In at least one embodiment of a method of preparing a solar cell of the present disclosure, the step of depositing a first layer comprising a first copper-based material comprises depositing a first layer comprising CIS, the step of depositing a second layer comprises depositing a second layer comprising CIS, and the step of depositing a second layer comprises depositing the second optional deposit layer between the first layer and the second layer and depositing the second layer comprising CIS upon the second optional layer. In an additional embodiment, the step of depositing a first layer comprising a first copper-based material comprises depositing a first layer comprising CIGS, and the step of depositing a second layer comprises depositing the second optional deposit layer between the first layer and the second layer and depositing the second layer comprising CIGS upon the second optional layer. In yet an additional embodiment, the step of depositing the first layer further comprises the step of depositing the first optional deposit layer between the substrate and the first layer. In another embodiment, the step of depositing a first optional deposit layer comprises depositing a first optional deposit layer comprising a material selected from the group consisting of a poly-allylamine hydrochlodride, poly-(sodium-4-styrene sulfonate, polyethylenimine, diallyldimethylammonium chloride, and acrylic acid.

In at least one embodiment of a method of preparing a solar cell of the present disclosure, the steps of depositing the first layer and depositing the second layer result in a combined layer having a thickness of less than 500 nm. In another embodiment, the step of depositing the first layer comprises depositing the first layer upon a substrate having a negatively-charged surface. In yet another embodiment, the step of depositing the first layer comprises depositing the first layer upon a substrate having a deposit of poly-allylamine hydrochlodride thereon. In an additional embodiment, the step of depositing the first layer upon a substrate comprises depositing the first layer comprising nanoparticles having a negative surface charge, and the step of depositing the second layer comprises depositing the second layer comprising nanoparticles having a positive surface charge.

In at least one embodiment of a method of preparing a solar cell of the present disclosure, the step of depositing the first layer comprises depositing the first layer upon a substrate having a deposit of poly-allylamine hydrochlodride thereon and a deposit of poly-(sodium-4-styrene sulfonate) on the deposit of poly-allylamine hydrochlodride, whereby the first copper-based material layer is positioned upon the substrate upon the deposit of poly-(sodium-4-styrene sulfonate). In another embodiment, the step of depositing the first layer upon a substrate comprises depositing the first layer comprising nanoparticles having a positive surface charge, and the step of depositing the second layer comprises depositing the second layer comprising nanoparticles having a negative surface charge. In at least one embodiment of a method of preparing a solar cell of the present disclosure, the step of depositing a first layer comprising a first copper-based material comprises depositing the first layer comprising a first copper-based material that is combined with poly-allylamine hydrochlodride to facilitate deposition of the first copper-based material on the substrate. In an additional embodiment, the step of depositing a second layer comprising a second copper-based material comprises depositing a second layer comprising a second copper-based material that is combined with poly-(sodium-4-styrene sulfonate) to facilitate deposition of the second copper-based material on the first layer. In yet an additional embodiment, the method further comprises the step of depositing a third layer comprising the first copper-based material or the second copper-based material upon the second layer. In another embodiment, the method further comprises the step of depositing a fourth layer comprising the first copper-based material or the second copper-based material upon the third layer. In yet another embodiment, the method further comprises the step of depositing additional alternating layers of the first copper-based material and/or the second copper-based material deposited upon the fourth layer.

In at least one embodiment of a method of preparing a solar cell of the present disclosure, the step of depositing a first layer comprising a first copper-based material comprises depositing the first layer comprising a first copper-based material that is combined with poly-(sodium-4-styrene sulfonate) to facilitate deposition of the first copper-based material on the substrate. In another embodiment, the step of depositing a second layer comprising a second copper-based material comprises depositing the second layer comprising a second copper-based material that is combined with poly-allylamine hydrochlodride to facilitate deposition of the second copper-based material on the first layer. In yet another embodiment, the method further comprises the step of depositing a third layer comprising the first copper-based material or the second copper-based material upon the second layer. In an additional embodiment, the method further comprises the step of depositing a fourth layer comprising the first copper-based material or the second copper-based material upon the third layer. In yet an additional embodiment, the method further comprises the step of depositing additional alternating layers of the first copper-based material and/or the second copper-based material deposited upon the fourth layer.

In at least one embodiment of a method of preparing a solar cell of the present disclosure, the method further comprises the step of depositing additional layers of one or more of the first copper-based material and the second copper-based material upon the second layer or upon one or more additional deposit layers upon the second layer. In an additional embodiment, the method further comprises the step of depositing a cadmium-based layer comprising a cadmium-based material upon a last layer of a copper-based material, the last layer comprising the second layer or a last deposited layer comprising a copper-based material. In yet an additional embodiment, the method further comprises the step of depositing a first zinc oxide layer comprising a first zinc oxide material upon the cadmium-based layer. In another embodiment, the method further comprises the step of depositing a second zinc oxide layer comprising a second zinc oxide material upon the first zinc oxide layer, the second zinc oxide material different than the first zinc oxide material.

In at least one embodiment of a method of preparing a solar cell of the present disclosure, the step of depositing a cadmium-based layer results in a cadmium-based layer having a thickness of about 50 nm. In another embodiment, the step of depositing a cadmium-based layer comprises depositing a cadmium-based layer comprising cadmium sulfide. In yet another embodiment, the step of depositing a first zinc oxide layer results in a first zinc oxide layer having a thickness about 80 nm and about 120 nm. In an additional embodiment, the step of depositing a first zinc oxide layer comprises depositing a first zinc oxide layer comprising intrinsic zinc oxide. In yet an additional embodiment, the step of depositing a second zinc oxide layer results in a second zinc oxide layer having a thickness between about 100 nm and about 140 nm. In another embodiment, the step of depositing a second zinc oxide layer comprises depositing a second zinc oxide layer comprising n-type zinc oxide.

In at least one embodiment of a method of preparing a solar cell of the present disclosure, the step of depositing a first layer upon a substrate comprises the step of depositing a first layer upon a substrate selected from the group consisting of an indium tin oxide coated glass substrate, a copper substrate, and a copper-coated substrate. In another embodiment, the step of depositing a second layer comprises depositing the second optional deposit layer between the first layer and the second layer, the second optional deposit layer comprising poly-allylamine hydrochlodride. In yet another embodiment, the step of depositing a second layer comprising a second copper-based material comprises depositing a second layer comprising a second copper-based material that is combined with poly-(sodium-4-styrene sulfonate) to facilitate deposition of the second optional deposit layer. In an additional embodiment, the method further comprises the step of depositing additional alternating deposits of poly-allylamine hydrochlodride and additional layers of one or more of the first copper-based material or the second copper-based material above the second layer.

In at least one embodiment of a method of preparing a solar cell of the present disclosure, the step of depositing a first layer comprising a first copper-based material comprises depositing the first layer comprising a first copper-based material that is combined with poly-(sodium-4-styrene sulfonate), and the step of depositing a second layer comprising a second copper-based material comprises depositing a second layer comprising a second copper-based material that is first combined with poly-(sodium-4-styrene sulfonate) and later combined with poly-allylamine hydrochlodride. In an additional embodiment, the method further comprises the step of depositing additional alternating layers of the first copper-based material and/or the second copper-based material deposited upon the second layer. In yet an additional embodiment, the step of depositing a first layer upon a substrate comprises the step of depositing a first layer upon a substrate selected from the group consisting of a planar substrate, a non-planar substrate, and a nano-planar substrate. In another embodiment, the step of depositing a first layer comprising a first copper-based material comprises depositing the first layer comprising a first copper-based material that is combined with poly-(sodium-4-styrene sulfonate) in an aqueous solution. In yet another embodiment, the step of depositing a second layer comprising a second copper-based material comprises depositing a second layer comprising a second copper-based material that is combined with poly-allylamine hydrochlodride in an aqueous solution.

In at least one embodiment of a method of preparing a solar cell of the present disclosure, the method further comprises the step of depositing a cadmium-based layer comprising a cadmium-based material upon a last layer of a copper-based material, the last layer comprising the last deposited layer comprising a copper-based material. In another embodiment, the method further comprises the step of depositing a first zinc oxide layer comprising a first zinc oxide material upon the cadmium-based layer. In another embodiment, the method further comprises the step of depositing a second zinc oxide layer comprising a second zinc oxide material upon the first zinc oxide layer, the second zinc oxide material different than the first zinc oxide material.

In at least one embodiment of a method of preparing a solar cell of the present disclosure, the step of depositing a first copper-based material upon a substrate comprises depositing a first copper-based material upon a substrate having a layer of poly(3,4-ethylenedioxythiophene) thereon. In another embodiment, the step of depositing the first layer further comprises the step of depositing the first optional deposit layer between the substrate and the first layer. In yet another embodiment, the step of depositing a first optional deposit layer comprises depositing a first optional deposit layer comprising poly(3,4-ethylenedioxythiophene). In an additional embodiment, the step of depositing a first layer comprising a first copper-based material comprises depositing a first layer comprising CIGS, and wherein the step of depositing a second layer comprises depositing a second layer comprising CIGS.

In at least one embodiment of a method of preparing a solar cell of the present disclosure, the step of depositing a first layer comprising a first copper-based material comprises depositing the first layer comprising a first copper-based material dispersed in one or both of isopropyl alcohol and an aqueous solution. In an additional embodiment, the method further comprises the step of positioning a second substrate comprising a layer of a zinc material deposited thereon upon an uppermost layer of either the first copper-based material or the second copper-based material. In yet an additional embodiment, the step of depositing a first copper-based material upon a substrate comprises depositing a first copper-based material upon a substrate having a layer of indium tin dioxide thereon. In another embodiment, the step of depositing a first optional deposit layer comprises depositing a first optional deposit layer comprising indium tin dioxide. In yet another embodiment, the step of depositing a first layer comprising a first copper-based material comprises depositing a first layer comprising CdS, and wherein the step of depositing a second layer comprises depositing a second layer comprising CIGS.

In at least one embodiment of a method of preparing a solar cell of the present disclosure, the method further comprises the step of positioning a second substrate comprising the second layer deposited thereon upon the first layer. In another embodiment, the second substrate comprises a layer of indium tin dioxide thereon, and wherein the layer of indium tin dioxide is present upon the second substrate prior to the second layer being deposited thereon. In yet another embodiment, the method further comprises the step of positioning a second substrate upon the second zinc oxide layer.

In at least one embodiment of a method of preparing a solar cell of the present disclosure, one or both of the first copper-based material and/or the second copper-based material comprises CIGS, the CIGS prepared by nitrogen-bubbling a quantity of oleylamine with heat and under vacuum, combining quantities of CuCl, elemental selenium, and InCl3 with the quantity of oleylamine with heat and stirring; adding a quantity of GaCl3 to form a combined mixture, and stirring the combined mixture with heat. In an additional embodiment, the combined mixture is further treated by cooling the combined mixture, dispersing the combined mixture in ethanol, sonicating the combined mixture, centrifuging the combined mixture to obtain a precipitate and a supernatant, discarding the supernatant, dispersing the precipitate in chloroform, repeating steps of sonicating, centrifuging, discarding, and dispersing at least one more time to obtain a final precipitate in chloroform. In another embodiment, the final precipitate in chloroform is further treated by dispersing the final precipitate in chloroform in ethanol to form an ethanol dispersion, sonicating the ethanol dispersion, centrifuging the ethanol dispersion to obtain a second precipitate and a second supernatant, discarding the second supernatant, dispersing the second precipitate in ethanol, repeating steps of sonicating, centrifuging, and discarding at least one more time to obtain a final precipitate, and dispersing the final precipitate in isopropyl alcohol and/or water In at least one embodiment of a method of preparing a solar cell of the present disclosure, the method comprises the steps of depositing a first layer comprising a first copper-based material upon a substrate, the first copper-based material electrically attracted to the substrate or to a first optional deposit layer deposited between the substrate and the first layer, and depositing a second layer comprising a second copper-based material upon the first layer or an second optional deposit layer deposited between the first layer and the second layer, the second copper-based material electrically attracted to the first layer or to the second optional deposit layer. In another embodiment, the first copper-based material and the second copper-based material are selected from the group consisting of copper indium gallium (di)selenide (CIGS), copper indium selenium (CIS), and cadmium sulfate (CdS), and the step of depositing the first layer further comprises the step of depositing the second optional deposit layer between the first layer and the second layer, the second optional deposit layer comprising a material selected from the group consisting of a poly-allylamine hydrochlodride, poly-(sodium-4-styrene sulfonate, polyethylenimine, diallyldimethylammonium chloride, and acrylic acid.

In at least one embodiment of a method of preparing a solar cell of the present disclosure, the method comprises the steps of depositing a first layer comprising a first copper-based material upon a substrate, the first copper-based material electrically attracted to the substrate or to a first optional deposit layer deposited between the substrate and the first layer, and depositing a second layer comprising a second copper-based material upon the first layer or an second optional deposit layer deposited between the first layer and the second layer, the second copper-based material electrically attracted to the first layer or to the second optional deposit layer, depositing a cadmium-based layer comprising a cadmium-based material upon a last layer of a copper-based material, the last layer comprising the second layer or a last deposited layer comprising a copper-based material, depositing a first zinc oxide layer comprising a first zinc oxide material upon the cadmium-based layer, and depositing a second zinc oxide layer comprising a second zinc oxide material upon the first zinc oxide layer, the second zinc oxide material different than the first zinc oxide material, wherein the first copper-based material and the second copper-based material are selected from the group consisting of copper indium gallium (di)selenide (CIGS), copper indium selenium (CIS), and cadmium sulfate (CdS).

BRIEF DESCRIPTION OF DRAWINGS

The foregoing aspects and other features of the present disclosure are explained in the following description, taken in connection with the accompanying drawings.

DETAILED DESCRIPTION

Figure 1:
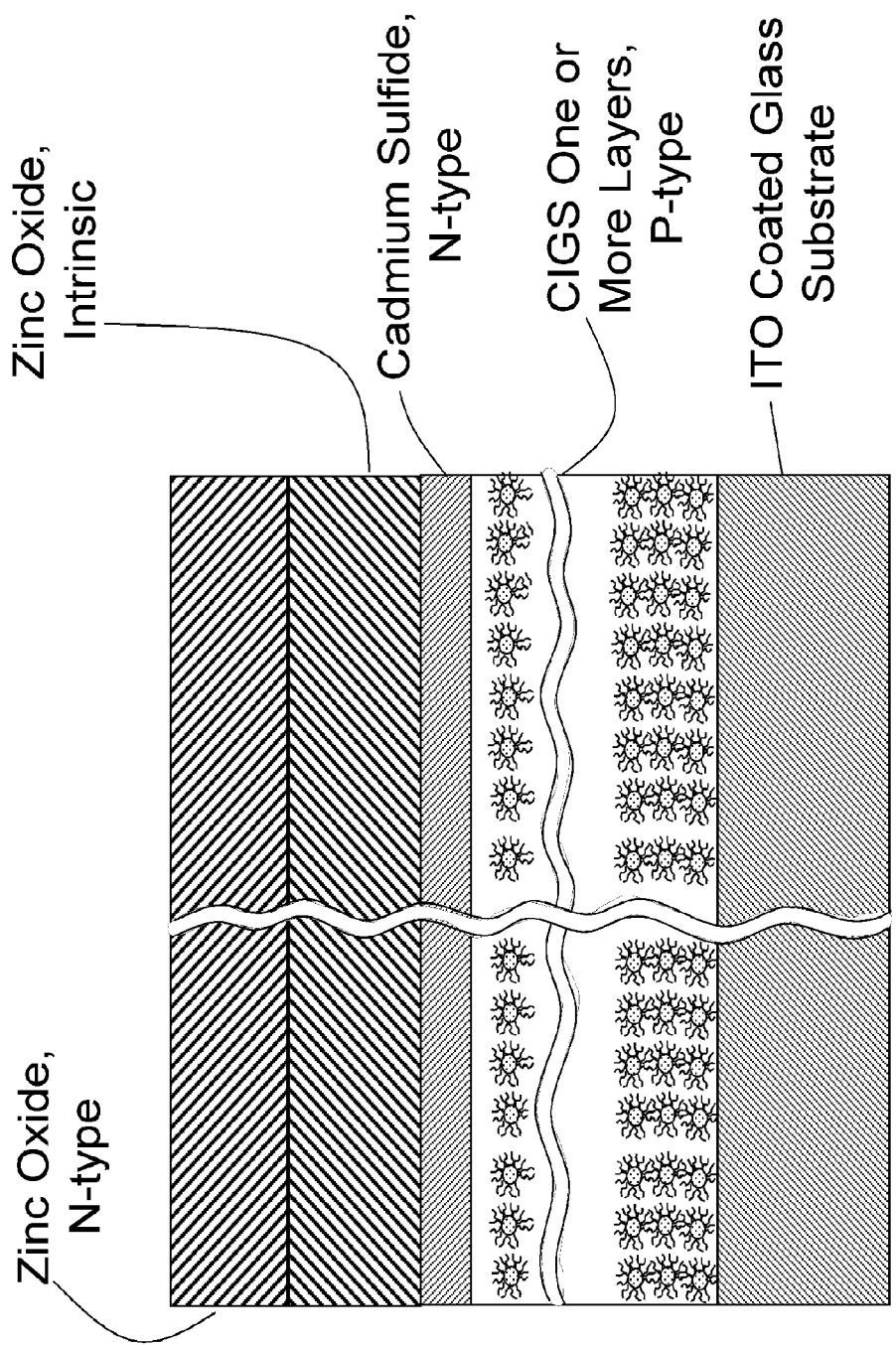
FIG. 1 depicts a schematic of an embodiment of a copper indium gallium selenium (CIGS) nanoparticles-based solar cell formed over an indium tin oxide glass coated substrate.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

The reader should appreciate that throughout the present disclosure nanoparticles made from copper indium gallium selenium (CIGS) are interchangeable with nanoparticles made from copper indium selenium (CIS). As referenced herein, the term "copper indium gallium selenium" may also be referred to as "copper indium gallium (di)selenide," each of which referred to herein in various instances as "CIGS."

The following disclosure provides a novel method for depositing CIGS or CIS nanoparticles structures through a layer-by-layer (LBL) nanoassembly for a solar cell application. LBL nanoassembly is a unique method based on sequential deposition of oppositely charged polyelectrolytes or nanoparticles on surfaces of different shapes and sizes. The LBL techniques provide the possibility of designing and fabricating ultrathin multilayer films and patterns with a precision in sub 10 nm, with defined molecular composition and properties. LBL deposition of nanoparticles such as silicon di-oxide, titanium di-oxide have been reported previously. For example, LBL self-assembly of nanolayers of 50 nm silica alternated with cationic poly(dimethyldiallyl ammonium chloride) has been reported. However, LBL deposition of CIGS or CIS has not been reported. In the present disclosure, 1) method steps for dispersion of CIGS/CIS in an aqueous solution are described followed by 2) method steps for LBL nanoassembly of the CIGS/CIS dispersed in the aqueous solution on a substrate to form the solar cell are described. In particular, synthesis of CIGS and CIS nanoparticles is first disclosed. The synthesized nanoparticles are not dispersible in water. Next various methods of converting the CIGS/CIS nanoparticles into water dispersible nanoparticles is described. Next LBL nanoassembly of these dispersible nanoparticles on a substrate is described.

Figure 2:
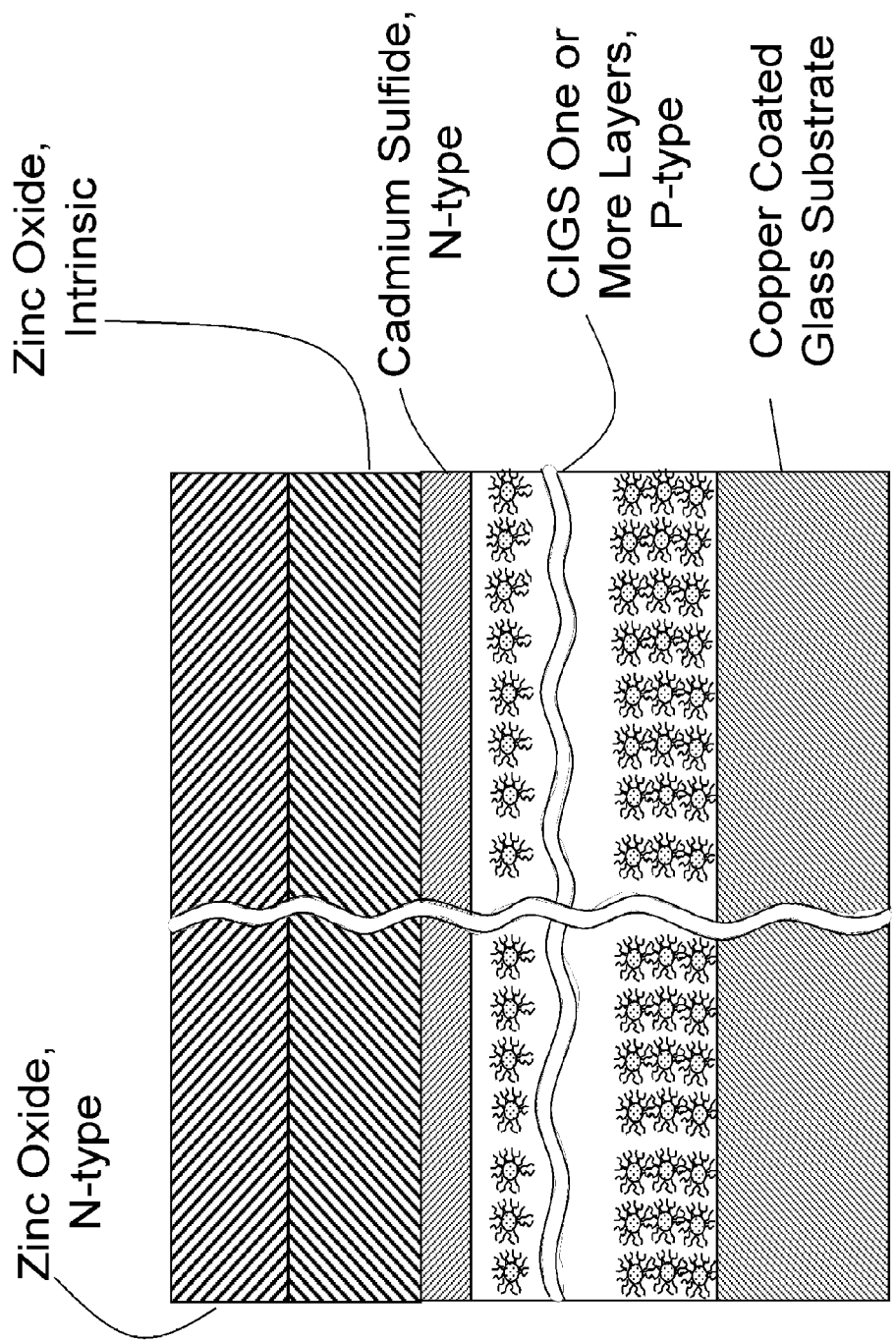
FIG. 2 depicts a schematic of an embodiment of the CIGS-based solar cell formed over a copper substrate.

FIGS. 1 and 2 depict schematic diagrams of CIGS nanoparticle-based thin film photovoltaic cells formed by the LBL method of the present disclosure on an indium tin oxide (ITO) coated glass substrate and on a copper coated substrate, respectively. However, the photovoltaic cells can be formed on other verities of substrates including but not limited to paper, plastic, and textile. In both cases, the CIGS nanoparticles are coated over the substrate (ITO coated or copper coated, respectively), with a layer of cadmium sulfide (n-type material), with a layer of intrinsic zinc oxide, and with a layer of n-type zinc oxide. In an exemplary embodiment, the CIGS nanoparticles layer can be about 500 nm thick, the layer of cadmium sulfide (n-type material) can be about 50 nm, the layer of n-type zinc oxide can be about 80-100 nm, the layer of n-type zinc oxide can be about 100-140 nm.

The Nanoassembly

The nanoassembly of the CIGS nanoparticles includes the following steps: 1) synthesis, purification and characterization of CIGS nanoparticles; 2) functionalization of CIGS nanoparticles using LBL coating of (sodium-4-styrene sulfonate) (PSS) and/or poly-allylamine hydrochloride (PAH) and other polyelectrolytes and ligands; 3) fabrication of thin film CIGS layers using functionalized nanoparticles through LBL nanoassembly; and 4) fabrication of thin film solar cell through the utilization of CIGS nano-layers, CIGS nanoparticles, and LBL nanoassembly.

Synthesis, Purification, and Characterization of CIGS Nanoparticles

The CIS nanoparticles are synthesized through chemical processes from metal chlorides which are purified and then characterized for size, surface charge and material properties. Copper chloride ($CuCl_2$), selenium (Se) powder, and indium chloride ($InCl_3$) are mixed as ingredients in oleylamine (OLA) which is used as a buffer (i.e., the background solution). The mixture is purified using centrifugation, suspension, and precipitation processes. An example of the above mixture includes 0.495 g of $CuCl_2$, 0.79 g Se powder, and 0.553 g $InCl_3$ which are mixed in a three neck flask in a glove box, followed by the addition of 50 mL of OLA. The mixture is heated at 240° C. while stirring for four hours. The synthesis is followed by the purification process to obtain the desired nanoparticles. The mixture is precipitated in excess ethanol, centrifuged, and suspended in chloroform to remove unreacted chemicals and larger particles. The suspended nanoparticles are precipitated and washed several times with alcohol and chloroform.

CIGS nanoparticles are synthesized by performing an exemplary procedure as outlined in the following steps: 20 ml of OLA is nitrogen bubbled for 2 hours and vacuum pulled for 12 hours while heating at 205° C. Next, 0.198 gm of CuCl, 0.316 gm elemental selenium, and 0.224 gm $InCl_3$ are mixed in OLA in a nitrogen-filled glove box and heated and stirred until the powders are dissolved. Next, 0.118 gm of $GaCl_3$ is added into flask from the preceding step. The mixture is stirred for 75 min while heating at 250° C.

In each of these cases (i.e., synthesis of CIGS or CIS, the synthesized nanoparticles are coated with a coating of OLA. However, OLA is not readily dispersible in water (or other aqueous solutions). Dispersibility in aqueous solutions is preferred for the LBL nanoassembly process according to the present disclosure.

In order to disperse the synthesized CIGS/CIS nanoparticles, the OLA coatings on the nanoparticles are manipulated. The OLA coating extends outward from the nanoparticles in a strand-like manner. One or a combination of several methods as follow can be used to make the CIGS/CIS nanoparticles dispersible in aqueous solutions.

Removing the OLA Coating

One method for making CIGS/CIS nanoparticles dispersible in aqueous solutions is to remove all or part of the OLA coating. According to one exemplary embodiment, the prepared mixture from the synthesis step is dispersed in excess ethanol after cooling, then sonicated for 15 min and centrifuged at 7000 rpm for 10 min. The precipitate from this step is collected while the supernatant is discarded. The precipitate is dispersed in chloroform and sonicated for 15 min and centrifuged at 13000 rpm. The precipitate from the previous step is discarded and an excess ethanol is added. After sonication for 15 min the solution is centrifuged at 12000 rpm. The cleaning steps are repeated for three more times. Next, an excess volume of ethanol is added in the CIGS/CIS synthesized nanoparticles in chloroform and centrifuged at 12000 rpm for 15 mins. The supernatant is discarded. Excess ethanol is added to the precipitate, sonicated for 15 mins, centrifuged at 10000 rpm and the supernatant is discarded. The last step is repeated for 2 more times. Excess water is added to the precipitate, sonicated for 15 mins, centrifuged at 15000 rpm, and supernatant is discarded. The last step is repeated for 5 more times. The collected precipitate is dispersed in water and sonicated for 15 min. As a result the some or all of the OLA coating can be removed allowing the synthesized CIGS/CIS nanoparticles to be dispersible in aqueous solutions. The CIGS/CIS nanoparticles that are dispersed in water have positive zeta potential (surface charge) of 60 mV.

Ligand Exchange

As discussed above, the synthesized nanoparticles are coated with a thin layer of OLA and as the OLA is not readily dispersible in water, the nanoparticles cannot be readily dispersed in water. Ligand-exchange is one method according to the present disclosure which is aimed at obtaining water dispersion of the nanoparticles by replacing OLA by soluble ligands, such as Mercaptoundecanoic acid (MUA) or Acrylic acid (AcA). In one exemplary embodiment, MUA ligand is exchanged with OLA according to the following steps: 1 gm of MUA is added to 10 ml of CIGS chloroform dispersion. The solution is slowly stirred for 24 hours resulting in a black precipitate, which can be separated from the supernatant by adding excess ethanol and centrifuging at 7000 rpm for 10 min. The resulting nanoparticles are then dispersible in water.

In another exemplary embodiment, AcA ligand is exchange with OLA according to the following steps: In a typical experiment CIGS is dispersed in Hexane. 3.6 ml of AcA is added to 0.4 ml of water and stirred for 10 min. 4 ml of OLA coated CIGS in Hexane is slowly added to the 4 ml of AcA and water. The particles settle at the Hexane-water interface. The settled nanoparticles are separated from supernatant by centrifuging at 10000 rpm for 5 min.

Functionalization of CIGS/CIS Nanoparticles Using LBL Coating of PSS and PAH

Another method for modifying the CIGS/CIS nanoparticles to be dispersible is to functionalize these particles. The OLA-coated nanoparticles can be coated with PSS/PAH in order to introduce a charged polyelectrolyte to the CIGS/CIS nanoparticles. It should be appreciated that other polyelectrolytes (e.g., Polyethyleneimine, also known as PEI; diallyldimethylammonium chloride, also known as PDDA; and acrylic acid, also known as PAA) can also be used. The polyelectrolyte attach to the strand-like OLA or to the CIGS/CIS nanoparticles. Once attached, the combination of the OLA-coated CIGS/CIS nanoparticles with polyelectrolytes (e.g., PSS or PAH) are dispersible in aqueous solutions. The polyelectrolyte attach to the strands of the OLA or to the nanoparticles. It should be noted that the polyelectrolytes are charged. For example, PAH is positively charged while PSS is negatively charge. The coating of the nanoparticles with PSS and PAH can be achieved by dispersing the nanoparticles in the corresponding polyelectrolyte.

Figure 3:
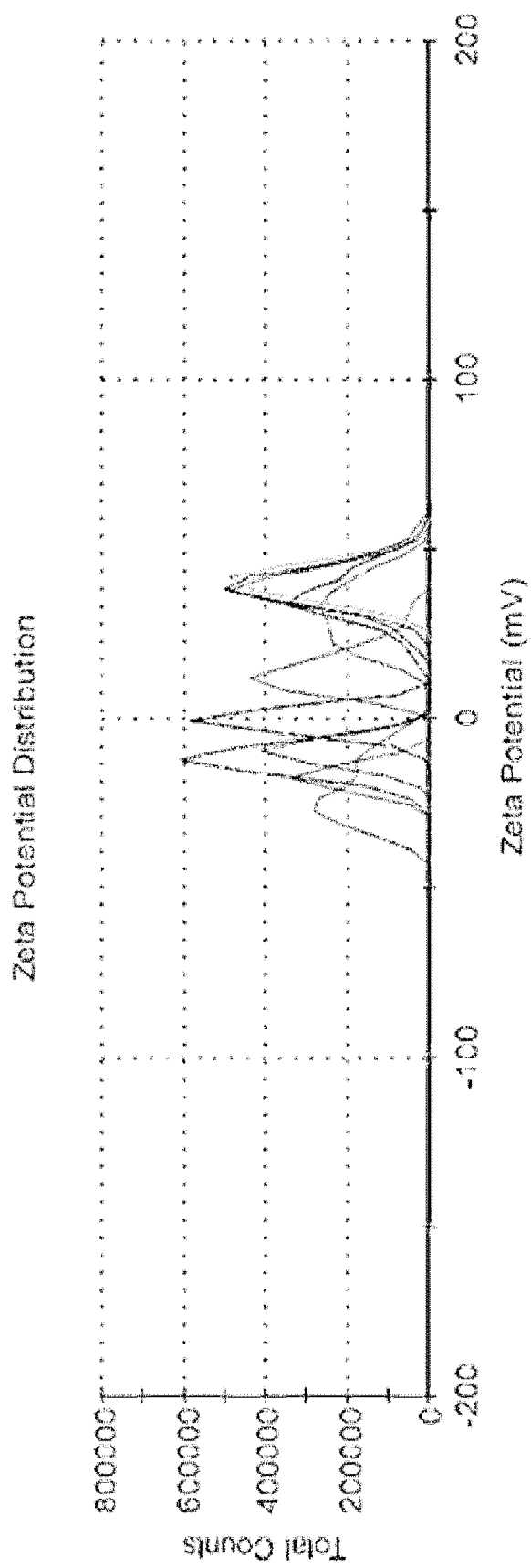
FIG. 3 depicts a graph of total count of nanoparticles vs. zeta potential (in mV) which is a measure of surface charge of nanoparticles.

According to the present disclosure, an exemplary method for adding PSS to CIGS nanoparticles is described according to the following steps: A dilute solution of PSS (15 µg/ml) is added slowly to CIGS nanoparticles dispersed in water. The zeta potential of the nanoparticles is measured using the Malvern Nanosizer instrument. As shown in FIG. 3 (graph of total count of nanoparticles vs. zeta potential of surface charge of nanoparticles), the zetapotential of the particles slowly moves towards zero with each additional amount of PSS. With more PSS added the zetapotential of the particles becomes negative. FIG. 3 shows zeta potential distribution of CIGS-PSS dispersed in water.

Alternative Method for Controlling Surface Charge of Nanoparticles

Figure 4:
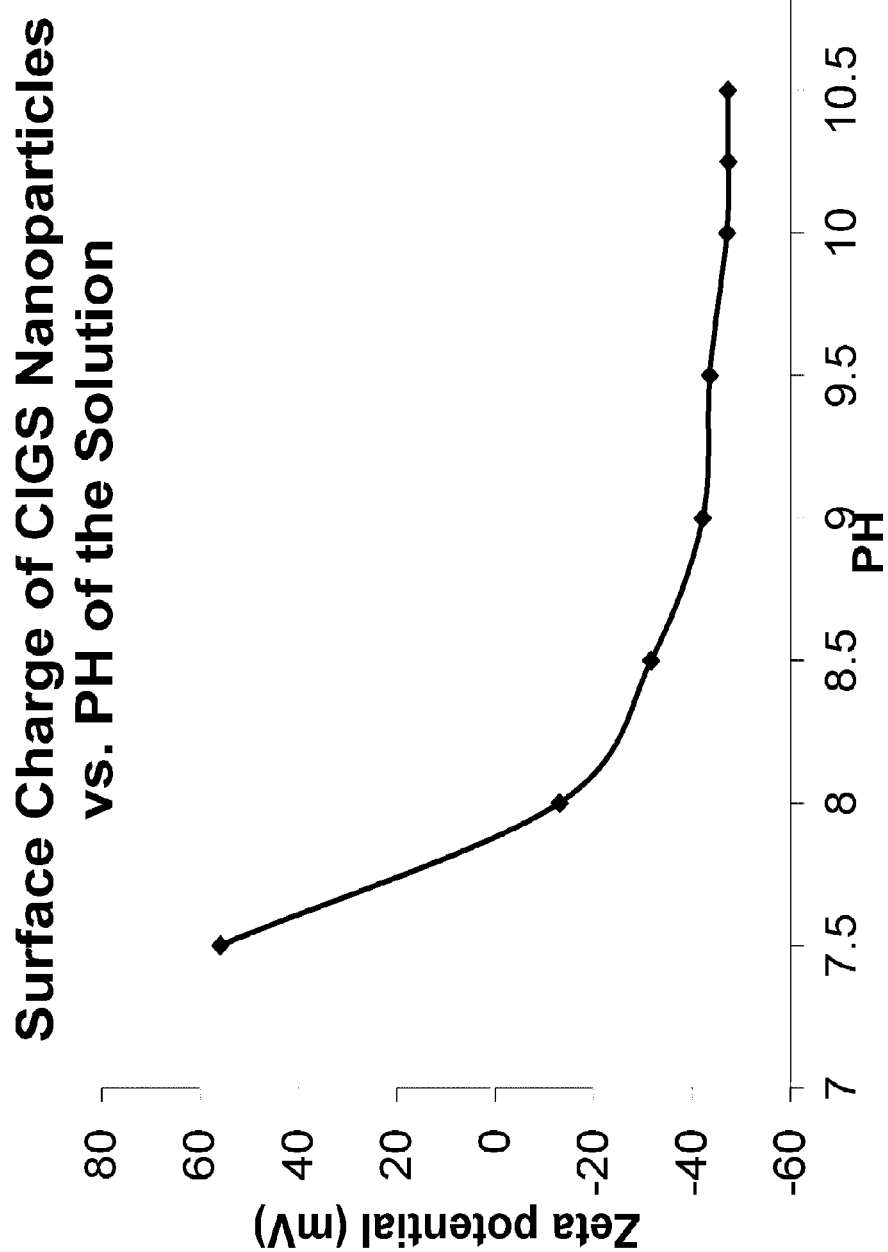
FIG. 4 depicts a graph of surface potential of nanoparticles vs. pH of the solution in which the particles are dispersed.

While in the above discussion, surface charge of CIGS/CIS nanoparticles have been manipulated by LBL deposition of PSS and PAH on the nanoparticles, adjusting PH of the aqueous solution can provide the same results. CIGS nanoparticles dispersed in water exhibit positive surface charge (+58 mV), herein denoted by CIGS+. Changing the pH of the solvent can reverse the surface charge of the particles. The pH of the solution with CIGS nanoparticles are slowly increased by adding a basic solution (e.g., NaOH) or an alkaline buffer solution and the surface charge is measured using Malvern Nanosizer. The results are shown in FIG. 4 (graph of zeta potential of nanoparticles vs. pH of solution). The results show that by increasing pH of the solution (e.g. adding NaOH), surface charge of CIGS particles decreases until it saturates at −51 mV, herein denoted by CIGS−. Thus the surface charge of the CIGS nanoparticles can be controlled through the pH of the solution. In a similar manner, the surface charge of the CIGS nanoparticles can be changed from negative to positive by lowering the pH of the solution. The pH of the solution can be lowered by adding an acidic solution (e.g., HCl) or an acidic buffer solution.

LBL Fabrication of Thin CIGS/CIS Nanoparticle Film

Three different exemplary methods are disclosed which can be carried out using the synthesized nanoparticles to LBL deposit these particles on to a substrate or to another layer of nanoparticles. In the first method, the nanoparticles are coated with LBL deposition of alternating layers of PSS and PAH in an aqueous solution to prevent the agglomeration of the nanoparticles. The dispersion of the nanoparticles can also be achieved by removing the OLA coating or by ligand exchange (eg. MUA and AcA) with OLA. The size and surface charge of the nanoparticles can be measured with zeta-potential and size measurement instrument (Malvern Nanosizer). In other words, the CIGS/CIS nanoparticles are alternatingly functionalized with PSS (negative charge) and PAH (positive charge). The substrate which has been properly prepared to have the appropriate surface charge is alternatingly dipped in the prepared solutions having CIGS/CIS nanoparticles with negative surface charge and positive surface charge. For example, CIGS/CIS nanoparticles functionalized with PSS and PAH. As a result of LBL deposition, a buildup of CIGS/CIS nanoparticles with alternating charge characteristics can be realized. For example, a buildup of substrate (with positive surface charge), CIGS-PSS, CIGS-PAH, CIGS-PSS, and CIGS-PAH can be deposited to build four layers of CIGS. Similarly, a buildup of substrate (with positive surface charge), CIGS−, CIGS+, CIGS−, and CIGS+ can be deposited to build four layers of CIGS.

In the second method, substrate coated with CIGS-PSS or CIGS-PAH or CIGS+ or CIGS− are dipped in solutions of PAH or PSS, respectively, in order to build a layer of PAH/PSS over the CIGS/CIS nanoparticles coated with PSS or PAH. Therefore, a positively charged substrate is first dipped in an aqueous solution carrying CIGS/CIS coated with PSS (as an example). Then the substrate is dipped in a solution of PAH to allow a layer of PAH to be coated over the CIGS/CIS that is coated with PSS. The resulting CIGS/CIS-PSS-PAH film can then be dipped into another aqueous solution of CIGS/CIS coated with PSS to build another layer. These layers can be built up on a quartz crystal microbalance (QCM) oscillator. The deposited film thickness can be measured by measuring changes in resonant frequency of the QCM. For example, a buildup of substrate (with positive surface charge), CIGS-PSS, PAH, CIGS-PSS, PAH, CIGS-PSS, PAH, and CIGS-PSS can be deposited to build four layers of CIGS.

In the third method, CIGS coated with PSS and CIGS coated with PSS and then coated with PAH (PSS-PAH) are alternatingly LBL deposited on a substrate. For example, a buildup of substrate (with positive surface charge), CIGS-PSS, CIGS-PSS-PAH, CIGS-PSS, and CIGS-PSS-PAH can be deposited to build four layers of CIGS.

Substrate preparation for any of the above methods may include initially treating the substrate with PSS and/or PAH. For example, a coating of copper on a glass substrate may have a weak negative surface charge that is not suitable for LBL deposition. Therefore, prior to depositing CIGS/CIS nanoparticles functionalized with PSS or PAH, a layer of PAH may first need to be deposited on the surface of the substrate to generate a stronger electrostatic bond for subsequent LBL deposition.

Figure 5:
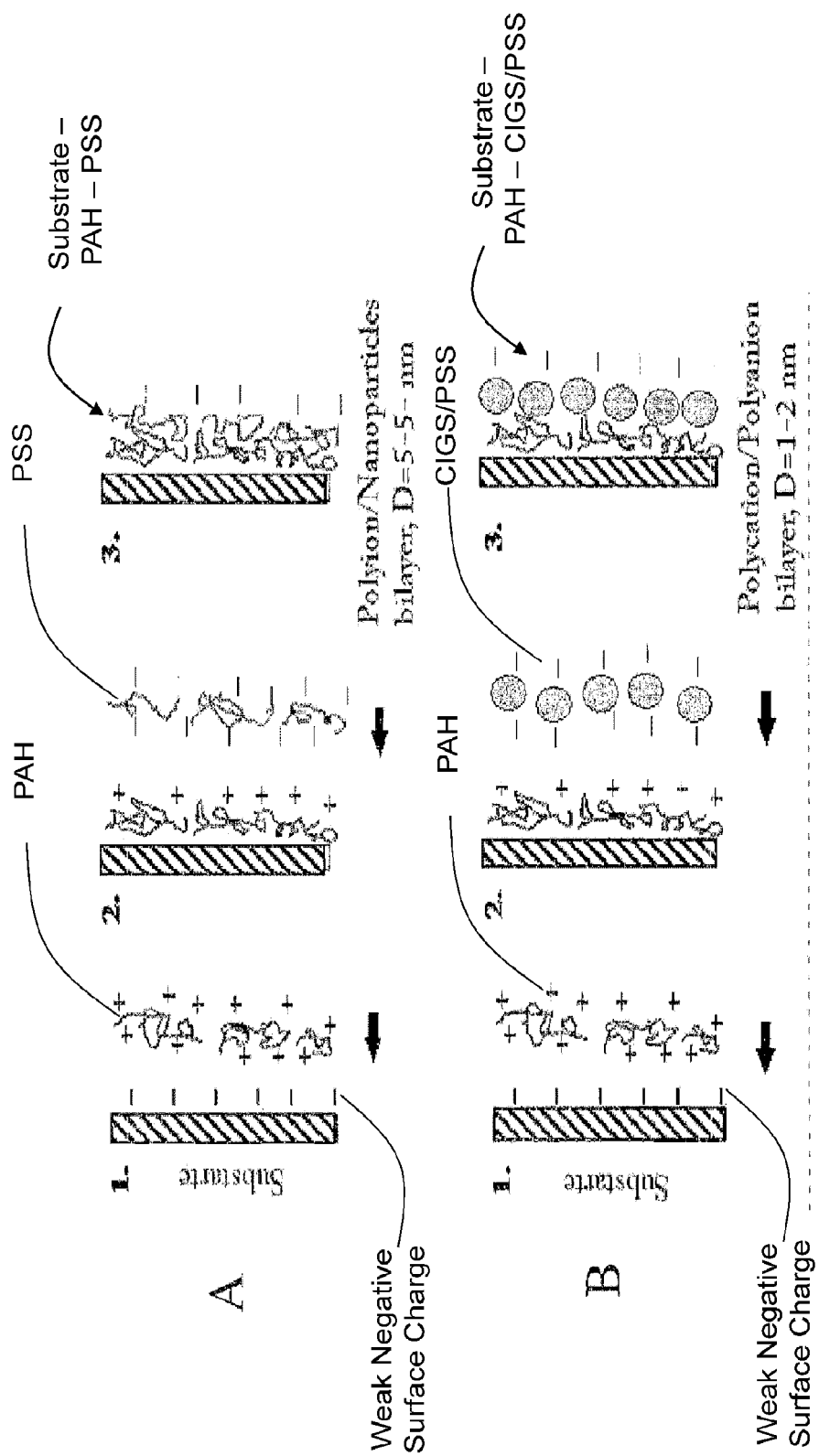
FIG. 5 depicts a schematic showing a Layer-by-Layer (LBL) nanoassembly process through alternate adsorption of polycations and polyanions.

FIG. 5 depicts exemplary schematics of the nanoassembly process based on LBL deposition. The LBL deposition is based on sequential deposition of oppositely charged polyelectrolytes or nanoparticles on surfaces of different shapes and sizes. The upper portion of FIG. 5 depicts nanoassembly of a double layer of polyelectrolytes on the substrate used in preparation for receiving CIGS/CIS nanoparticles functionalized with PAH. In the upper portion (i.e., FIG. 5A) the schematic referenced by number 1 (i.e., FIG. 5A1) depicts formation of PAH on a weak negatively charged substrate. The weak negative charge of the substrate may not be sufficient to successfully LBL deposit nanoparticles. The schematic referenced by number 2 (i.e., FIG. 5A2) depicts further formation of PSS on the structure of FIG. 5A1. FIG. 5A3 depicts the nanoassembly of these layers. The resulting coated substrate is now ready for accepting positively charge CIGS/CIS nanoparticles coated with PAH (functionalized).

The lower portion of FIG. 5 (i.e., FIG. 5B) depicts nanoassembly of a single layer of polyelectrolytes on the substrate used in preparation for receiving CIGS/CIS nanoparticles functionalized with PSS. FIG. 5B1 depicts formation of PAH on a weak negatively charged substrate. FIG. 5B2, depicts formation of CIGS nanoparticles functionalized with PSS coming into contact with the structure depicted in FIG. 5B1. FIG. 5B3 depicts the nanoassembly of these layers.

Figure 6:
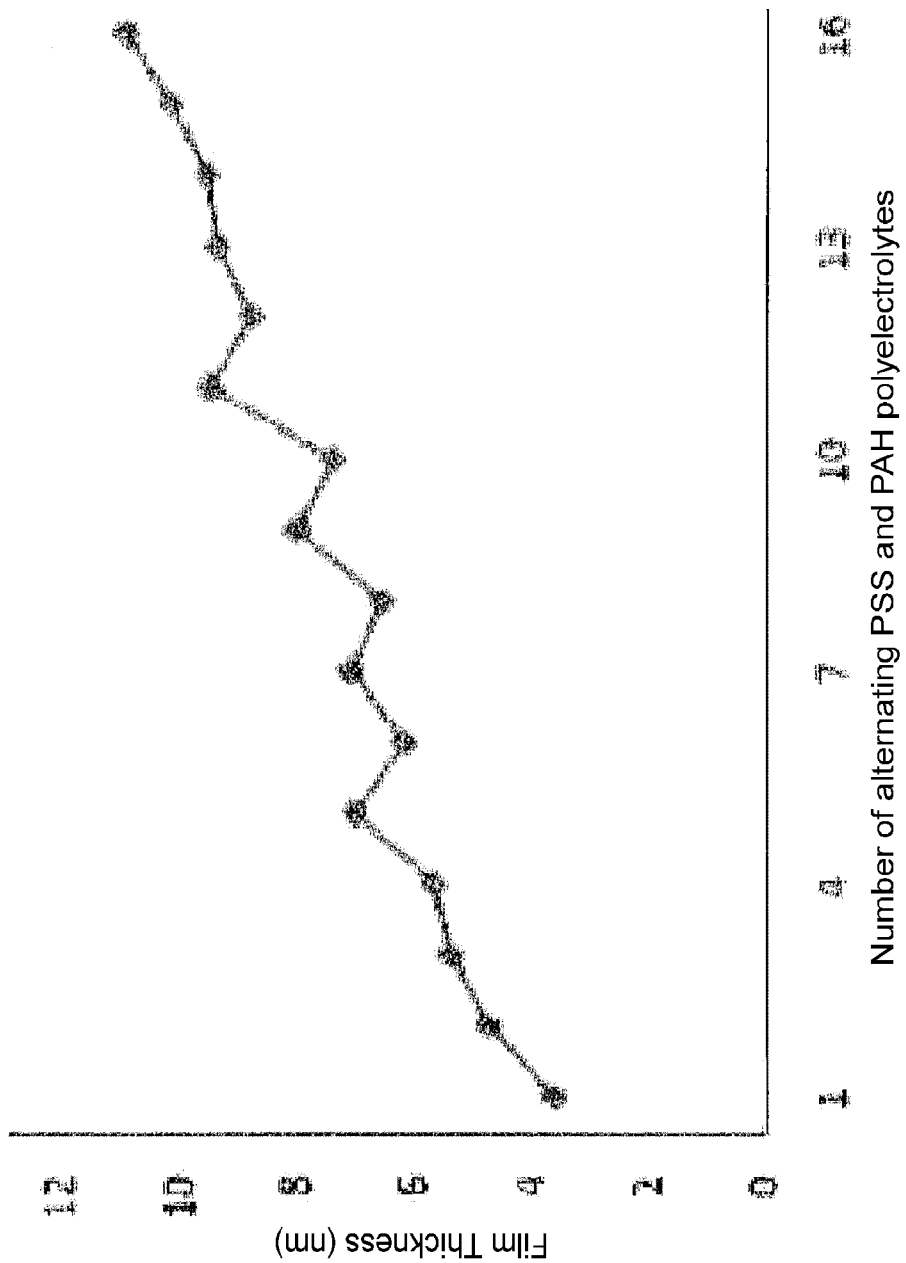
FIG. 6 depicts a graph of film thickness vs. the number of alternating layers of poly-(sodium-4-styrene sulfonate) (PSS) and/or poly-allylamine hydrochloride (PAH).

As discussed above, the LBL process is based on immersing a substrate alternately in PSS and PAH solutions to build an appropriate coatings by LBL deposition. FIG. 6 depicts a graph of a film thickness (in nm) vs. number of alternating PSS and PAH polyelectrolytes.

After sufficient charge has been developed on the substrate by formation of PSS and/or PAH to hold the synthesized nanoparticles, the substrate is alternately dipped in nano particles solution or the functionalized (e.g., coated with PSS, PAH, and PSS-PAH) nanoparticle solutions described in the above methods.

FIG. 6 depicts a graph of film thickness vs. the number of alternating layers of poly-(sodium-4-styrene sulfonate) (PSS) and/or poly-allylamine hydrochloride (PAH).

Figure 7:
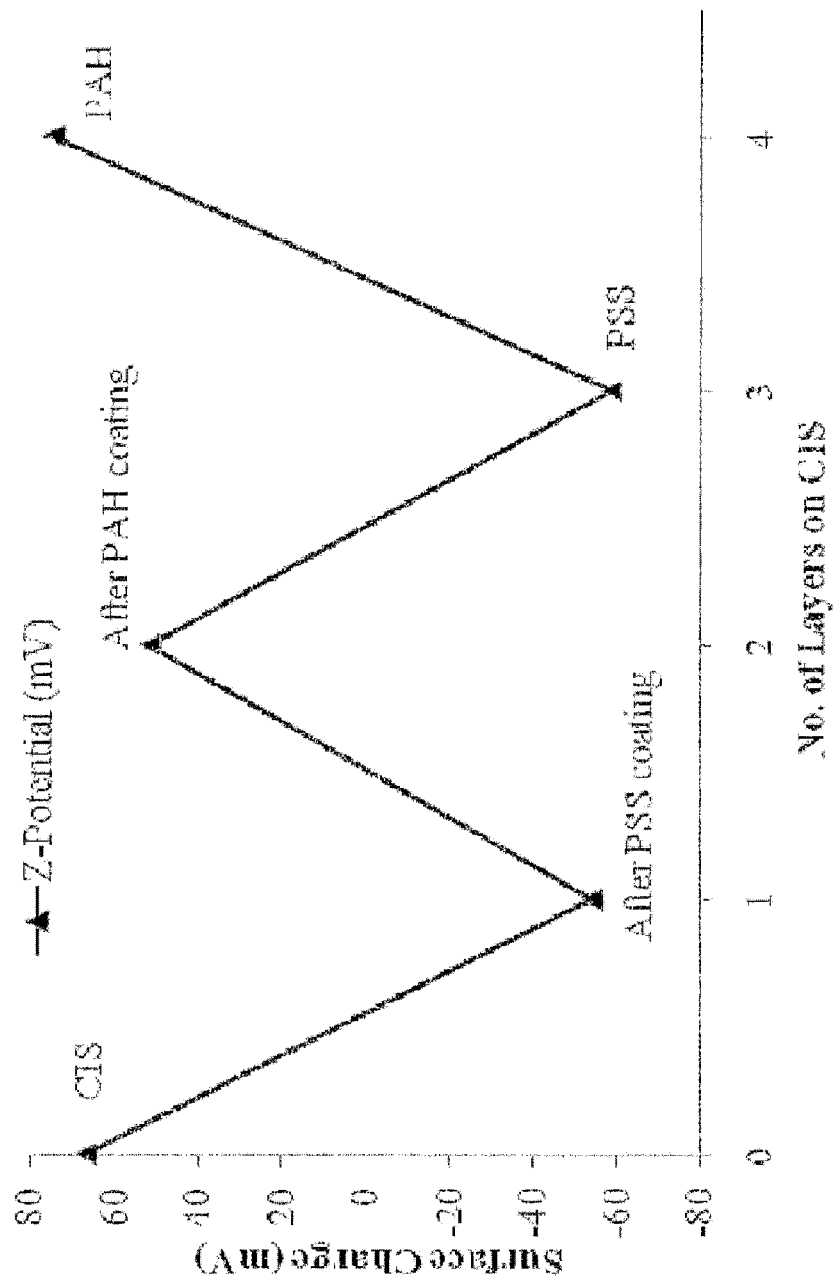
FIG. 7 depicts a graph of surface charge of copper indium selenium (CIS) nanoparticles, showing alternate charges when coated PSS and/or PAH.

FIG. 7 depicts a graph of surface charge vs. number of PSS or PAH coatings over CIGS/CIS nanoparticles. As indicated, after the synthesis and purification, the surface charge of the nanoparticles in water is shown to be about 60 mV. The CIGS/CIS nanoparticles are coated with PSS by introducing PSS in the CIGS/CIS nanoparticles solution and the solution is centrifuged at 7000 rpm for 15 min. The supernatant is discarded and the precipitate is dispersed in water, the surface charge of the coated nanoparticles drops to about −60 mV. Similarly, after formation of another layer of PAH coating on the CIGS/CIS nanoparticles coated with PSS, the surface charge increases to about 60 mV. This saw tooth behavior continues with formation of additional layers of PSS or PAH on the CIGS/CIS nanoparticles.

Figure 8:
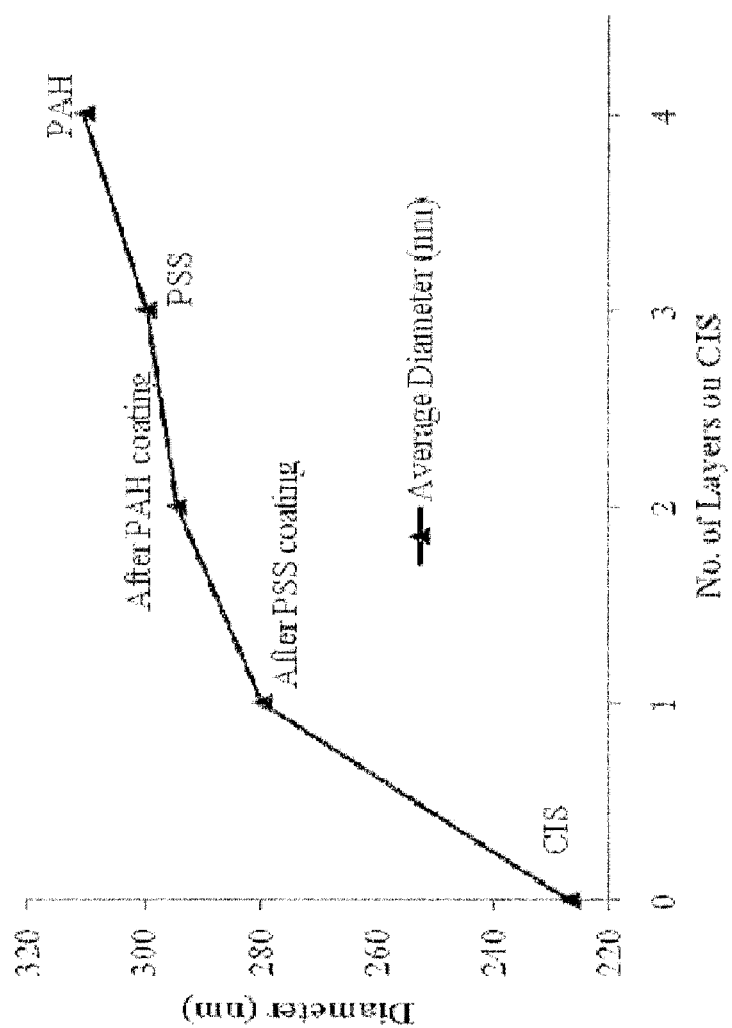
FIG. 8 depicts a graph of average diameter of the nanoparticles after formation of each layer of PSS or PAH.

FIG. 8 depicts a graph of the size of CIS nanoparticles with PSS and PAH coatings vs. the number of layers of PSS and PAH on the CIS nanoparticles. As depicted, with only CIS nanoparticles, the diameter of the nanoparticles is about 225 nm. After the first layer of PSS that is LBL deposited on the CIS nanoparticles, the diameter of the CIS/PSS nanoparticles is about 280 nm. After a layer of PAH is LBL deposited on the CIS/PSS nanoparticles, the diameter of the nanoparticles increases to about 285 nm. Third and fourth layers of alternating PSS and PAH result in diameters of the nanoparticles of about 300 nm and 310 nm, respectively.

Figure 9:
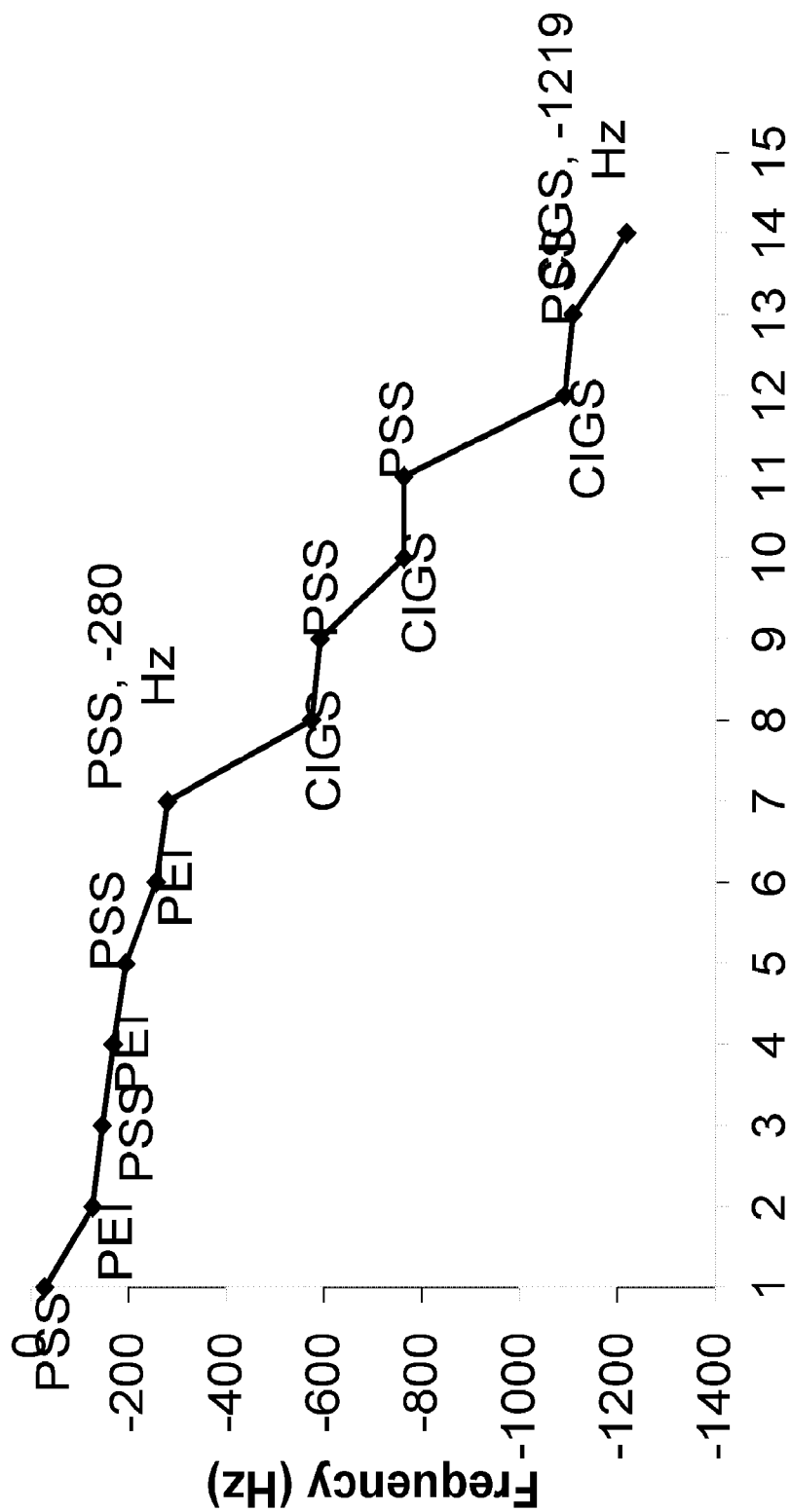
FIG. 9 depicts a graph of decrease in resonance frequency of a quartz crystal microbalance (QCM) vs., initially, the number of alternating layers of PEI and PSS and then alternating layers of positively charged CIGS nanoparticles (CIGS+) and PSS.

FIG. 9 depicts a graph of decrease in resonance frequency of a quartz crystal microbalance (QCM) vs., initially, the number of alternating layers of PEI and PSS and then alternating layers of positively charged CIGS nanoparticles (CIGS+) and PSS. The decrease in the resonance frequency depicts the addition of mass on the crystal and therefore depicts the increase in thickness of the deposited film. As depicted, the resonance frequency of a QCM decreases, but rather slowly, with each alternate deposition of PEI and PSS.

The deposition of 6 layers of PEI/PSS resulted in 280 Hz decrease in the resonance frequency of QCM. 7 layers of CIGS/PSS reduced the resonance frequency of the QCM by 1219 Hz.

Figure 10:
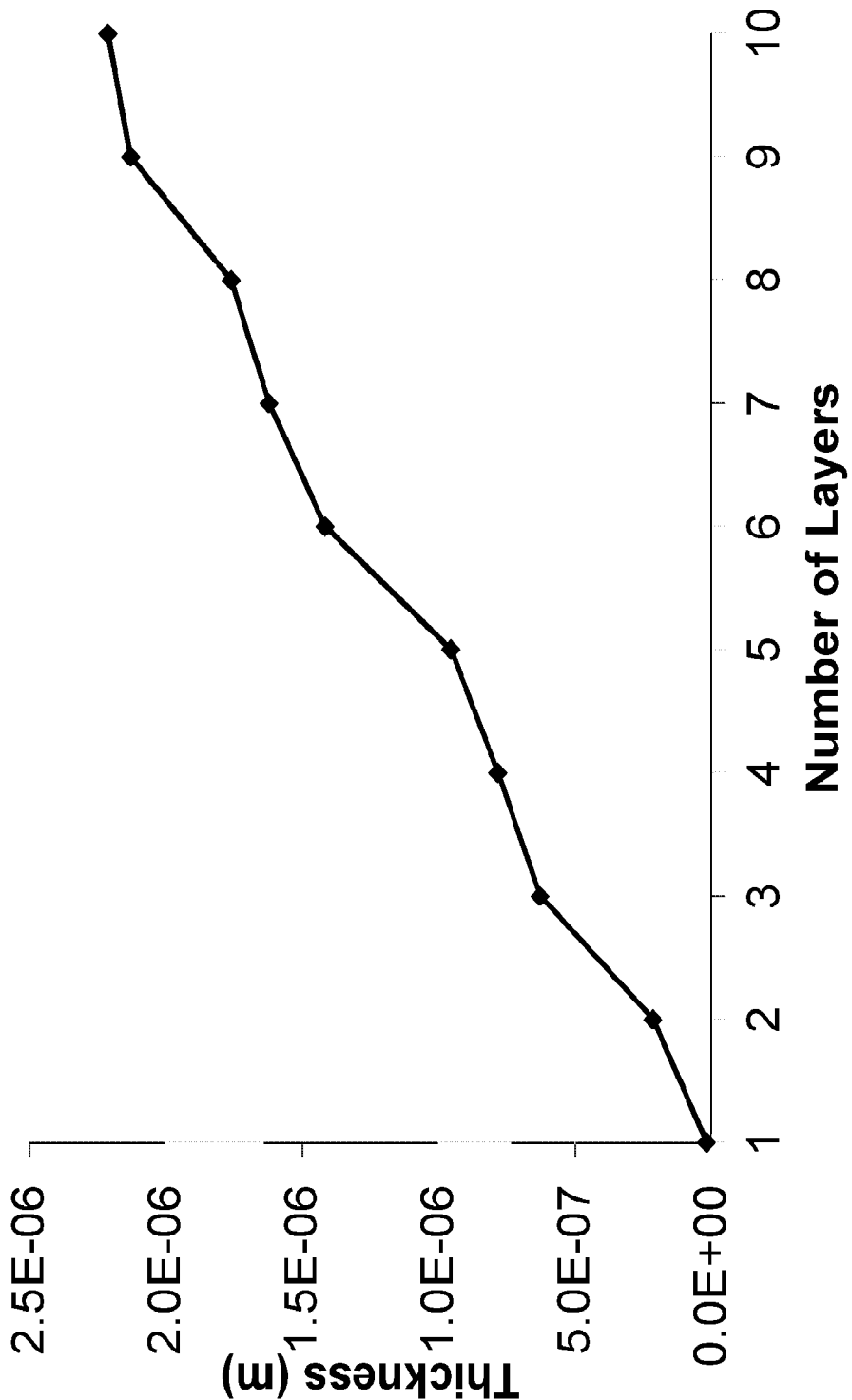
FIG. 10 depicts a graph of film thickness vs. the number of alternating layers of positively charged CIGS nanoparticles and negatively charged CIGS nanoparticles.

FIG. 10 depicts a graph of film thickness vs. the number of alternating layers of positively charged CIGS nanoparticles and negatively charged CIGS nanoparticles. As depicted, 10 layers of CIGS produced an about 2.25 micrometer thick film.

Fabrication of Thin Film Solar Cell Through the Utilization of CIGS Nano-Layers CIGS Nanoparticles, and LBL Nano-assembly With the thin CIGS nanoparticle film fabricated, the same LBL deposition method used in generating functionalized nanoparticles is also used to develop the solar cells. Schematic diagrams of the solar cell are depicted in FIGS. 1 and 2. The functionalized nanoparticles are deposited on an ITO coated (or copper coated or any conductive material such as Molybdenum or Poly(3,4-ethylenedioxythiophene) poly(styrenesulfonate) (PEDOT)) glass substrate (or other substrates including but not limited to flexible substrates such as paper, plastic, and textile). Cadmium Sulfide buffer layer, followed by Zinc Oxide layers are deposited to form top conductors of the solar cell. The use of nanoparticles including LBL self-assembly process improves the efficiency and intensively lowers the cost of the developed solar cell system.

Referring back to FIGS. 1 and 2, the CIGS and CIS nanoparticle film can be deposited using LBL process where the nanoparticles are deposited on the substrate in alternate with polyelectrolytes or nanoparticles of other material which enhance the solar cell efficiency.

The CIGS and CIS nanoparticles coated with polyelectrolytes such as PSS or PAH are deposited on the substrate in alternate with polyelectrolytes or nanoparticles of other material which enhance the solar cell efficiency.

The CIGS and CIS nanoparticles coated with ligands such as MUA or AcA are deposited on the substrate in alternate with polyelectrolytes or nanoparticles of other material which enhance the solar cell efficiency.

The CIGS and CIS nanoparticles dispersed in water and surface charge controlled by pH deposited on the substrate in alternate with polyelectrolytes or nanoparticles of other material which enhance the solar cell efficiency.

The CIGS and CIS nanoparticles coated with polyelectrolytes with opposite charge are deposited on the substrate to form the thin film.

The CIGS and CIS nanoparticles coated with ligands with opposite charge are deposited on the substrate to form the thin film.

The CIGS and CIS nanoparticles dispersed in water with opposite charge are deposited on the substrate to form the thin film.

Figure 11:
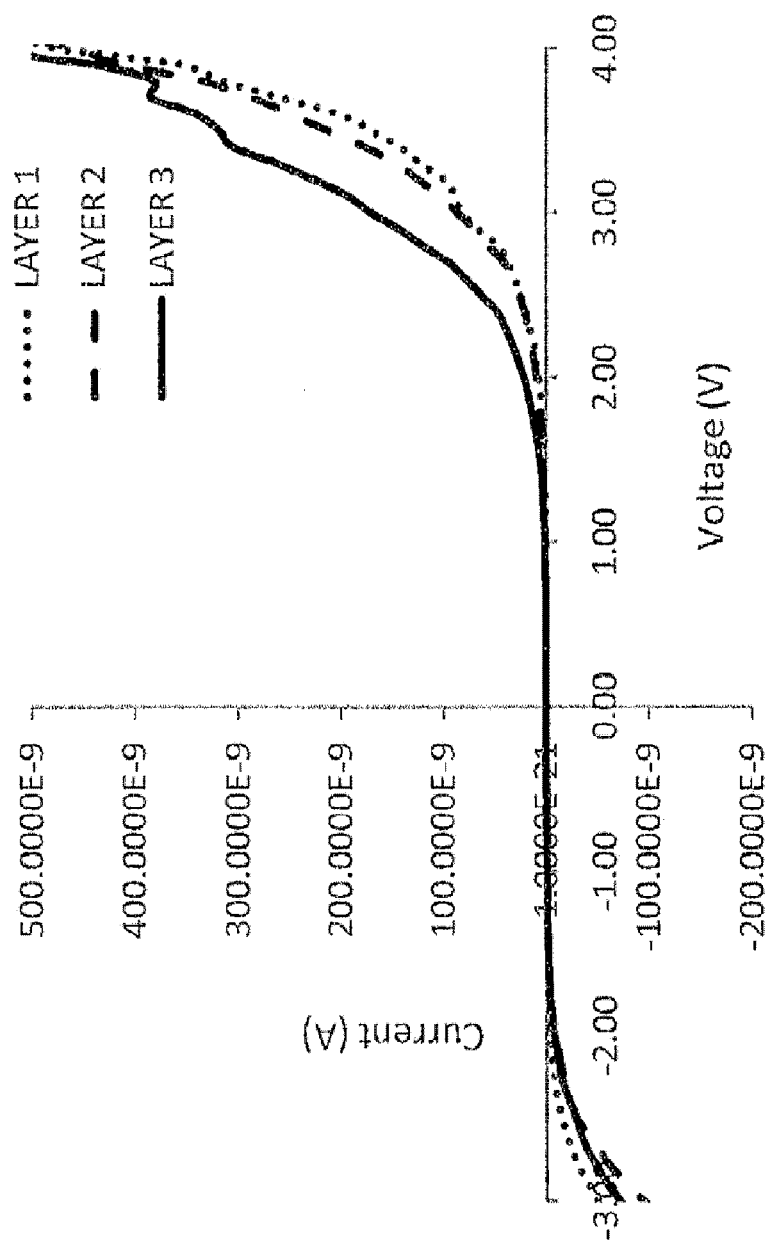
FIG. 11 depicts a graph of current vs. voltage characteristics of a film of CIGS and PSS nanoparticles.

Referring to FIG. 11, a graph of current vs. voltage characteristic of the solar cell with a construction according the present disclosure is depicted. The different graphs represent the number of CIGS nanoparticles layers in the construction.

As discussed above, the reader should appreciate that while PSS and PAH are referenced in the present disclosure, other polyelectrolytes and ligands may also be used. Furthermore, other nanoparticles in addition to CIGS and CIS may also be used in connection with the foregoing LBL nanoassembly.

The reader should further appreciate the nanoassembly steps described above may be applicable to a variety of different applications. For example, the same LBL deposition method may be used in forming supercapacitors for ultra-enhanced charge carrying capability or batteries for high energy density.

Figure 12:
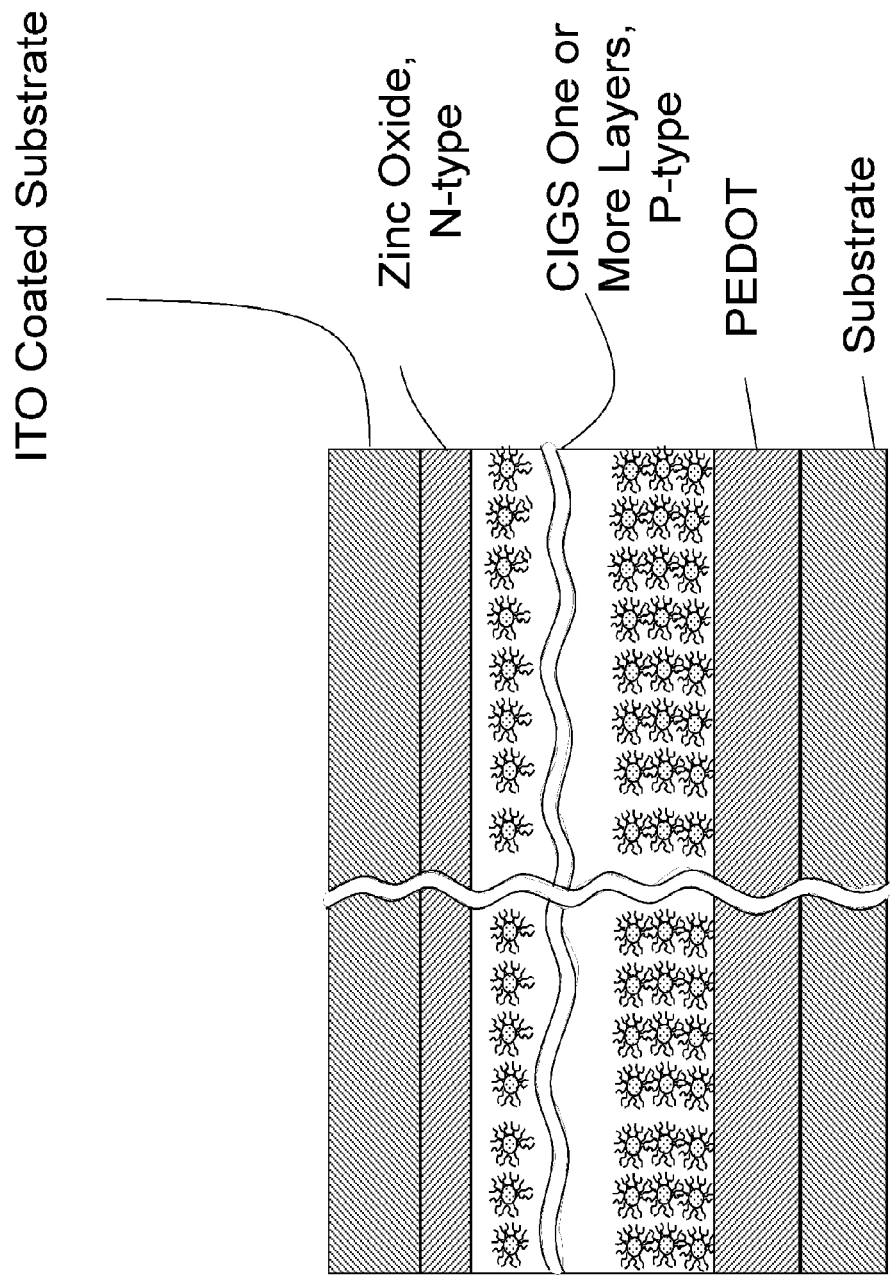
FIG. 12 depicts a schematic of an embodiment of solar cell according to the present disclosure.

According to another embodiment of the present disclosure, a solar cell device is disclosed fabricated by depositing consecutive layers of PEDOT, CIGS, and n-type zinc oxide on a substrate, wherein an ITO coated substrate can be used as the top electrode. The device schematic is shown in FIG. 12. The device in FIG. 12 can be constructed in accordance with the follow method steps: PEDOT is drop-casted on the substrate and heated up to 250 C for 15 min. CIGS nanoparticles dispersed in IPA is drop-casted on the PEDOT film at room temperature. A layer of n-type ZnO is spin-coated on an ITO coated glass. The two substrate plates are then assembled together as shown in FIG. 12. The layers of PEDOT, CIGS (dispersed in IPA or water), and n-type ZnO are also assembled using the LBL process.

Figure 13:
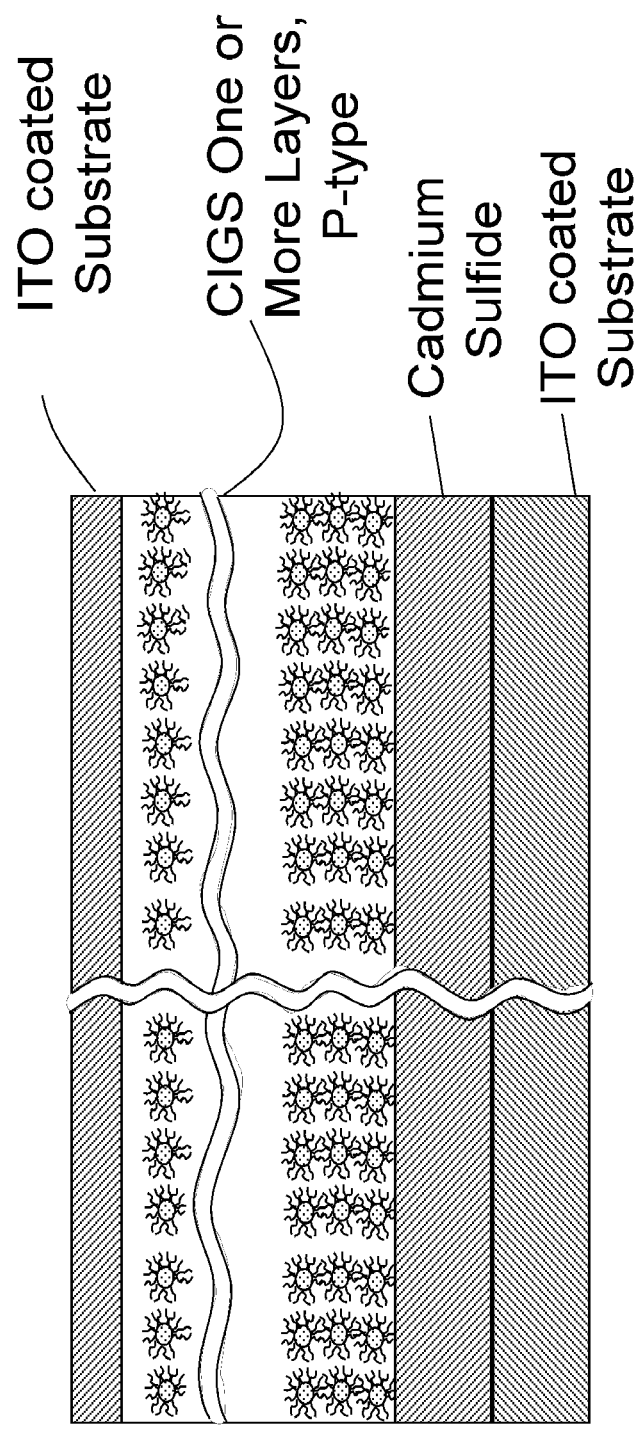
FIG. 13 depicts a schematic of an embodiment of solar cell according to the present disclosure.

According to another embodiment of the present disclosure, a solar cell device is disclosed fabricated by drop-casting and/or LBL process. CdS is deposited on an ITO coated substrate and heated at 90 C for 90 min, and then the temperature is raised to 450 C for 30 min. CIGS is deposited on another ITO coated substrate at room temperature. The device is then assembled as shown in the FIG. 13.

Those skilled in the art will recognize that numerous modifications can be made to the specific implementations described above. Therefore, the following claims are not to be limited to the specific embodiments illustrated and described above. The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

The invention claimed is:

1. A solar cell, comprising:
   a substrate, wherein the substrate comprises a layer of indium tin dioxide thereon;
   a first layer comprising a first copper-based material deposited upon the substrate, the first copper-based material electrically attracted to the substrate; and
   a second layer comprising a second copper-based material deposited upon the first layer, the second copper-based material electrically attracted to the first layer;
   wherein the first copper-based material and the second copper-based material comprise copper indium gallium (di)selenide (CIGS) nanoparticles or copper indium selenium (CIS) nanoparticles;
   wherein the CIGS nanoparticles or the CIS nanoparticles are coated with either poly-allylamine hydrochloride (PAH) or poly-(sodium-4-styrene sulfonate) (PSS).

2. The solar cell of claim 1, wherein the first copper-based material is different from the second copper-based material.

3. The solar cell of claim 2, wherein the first copper-based material comprises CIS and wherein the second copper-based material comprises CIGS.

4. The solar cell of claim 2, wherein the first copper-based material comprises CIGS, and wherein the second copper-based material comprises CIS.

5. The solar cell of claim 2, wherein the first copper-based material comprises CIS and wherein the second copper-based material comprises CIGS.

6. The solar cell of claim 2, wherein the first copper-based material comprises CIGS, and wherein the second copper-based material comprises CIS.

7. The solar cell of claim 1, wherein the first copper-based material and the second copper-based material comprise the same material.

8. The solar cell of claim 7, wherein the first copper-based material and the second copper-based material each comprise CIS.

9. The solar cell of claim 7, wherein the first copper-based material and the second copper-based material each comprise CIS.

10. The solar cell of claim 7, wherein the first copper-based material and the second copper-based material each comprise CIGS.

11. The solar cell of claim 7, wherein the second optional deposit layer comprises a deposit layer comprising a material selected from the group consisting of a poly-allylamine hydrochloride, poly-(sodium-4-styrene sulfonate), polyethylenimine, diallyldimethylammonium chloride, and acrylic acid.

12. The solar cell of claim 1, wherein the first layer and the second layer together have a thickness of less than 500 nm.

13. The solar cell of claim 1, wherein the substrate comprises a negatively-charged surface.

14. The solar cell of claim 13, wherein the negatively-charged substrate surface has a deposit of PAH thereon, whereby the first layer is deposited upon the substrate upon the deposit of PAH.

15. The solar cell of claim 14, wherein the first copper-based material comprises nanoparticles coated with PSS, and wherein the second copper-based material comprises nanoparticles coated with PAH.

16. The solar cell of claim 13, wherein the negatively-charged substrate surface has a deposit of PAH thereon, and wherein the deposit of PAH has a deposit of PSS thereon, whereby the first layer is deposited upon the substrate upon the deposit of PSS.

17. The solar cell of claim 16, wherein the first copper-based material comprises nanoparticles coated with PAH, and wherein the second copper-based material comprises nanoparticles coated with PSS.

18. The solar cell of claim 1, wherein the first copper-based material is combined with PAH to facilitate deposition of the first copper-based material on the substrate.

19. The solar cell of claim 18, wherein the second copper-based material is combined with PSS to facilitate deposition of the second copper-based material on the first layer comprising the first copper-based material.

20. The solar cell of claim 19, further comprising:
a third layer comprising the first copper-based material or the second copper-based material, which third layer is deposited upon the second layer.

21. The solar cell of claim 20, further comprising:
a fourth layer comprising the first copper-based material or the second copper-based material, which fourth layer is deposited upon the third layer.

22. The solar cell of claim 21, further comprising:
additional alternating layers of the first copper-based material and/or the second copper-based material deposited upon the fourth layer.

23. The solar cell of claim 1, wherein the first copper-based material is combined with PSS to facilitate deposition of the first copper-based material on the substrate.

24. The solar cell of claim 23, wherein the second copper-based material is combined with PAH to facilitate deposition of the second copper-based material on the first layer.

25. The solar cell of claim 24, further comprising:
a third layer comprising the first copper-based material deposited upon the second layer.

26. The solar cell of claim 25, further comprising:
a fourth layer comprising the second copper-based material deposited upon the third layer.

27. The solar cell of claim 26, further comprising:
additional alternating layers of one or more of the first copper-based material and the second copper-based material deposited upon the fourth layer.

28. The solar cell of claim 1, further comprising:
additional layers of one or more of the first copper-based material and the second copper-based material deposited upon the second layer or upon one or more additional deposit layers upon the second layer.

29. The solar cell of claim 28, further comprising:
a cadmium-based layer comprising a cadmium-based material deposited upon a last layer of a copper-based material, the last layer comprising the last deposited layer comprising a copper-based material.

30. The solar cell of claim 29, further comprising:
a first zinc oxide layer comprising a first zinc oxide material deposited upon the cadmium-based layer.

31. The solar cell of claim 30, further comprising:
a second zinc oxide layer comprising a second zinc oxide material deposited upon the first zinc oxide layer, the second zinc oxide material different than the first zinc oxide material.

32. The solar cell of claim 1, further comprising:
a cadmium-based layer comprising a cadmium-based material deposited upon a last layer of a copper-based material, the last layer comprising the second layer or a last deposited layer comprising a copper-based material.

33. The solar cell of claim 32, further comprising:
a first zinc oxide layer comprising a first zinc oxide material deposited upon the cadmium-based layer.

34. The solar cell of claim 33, further comprising:
a second zinc oxide layer comprising a second zinc oxide material deposited upon the first zinc oxide layer, the second zinc oxide material different than the first zinc oxide material.

35. The solar cell of claim 34, further comprising:
a second substrate positioned upon the second zinc oxide layer.

36. The solar cell of claim 34, wherein the cadmium-based material, the first zinc oxide material, and the second zinc oxide material form top conductors of the solar cell.

37. The solar cell of claim 32, wherein the cadmium-based layer has a thickness of about 50 nm.

38. The solar cell of claim 32, wherein the cadmium-based material comprises cadmium sulfide.

39. The solar cell of claim 33, wherein the first zinc oxide layer has a thickness between about 80 nm and about 120 nm.

40. The solar cell of claim 33, wherein the first zinc oxide material comprises intrinsic zinc oxide.

41. The solar cell of claim 34, wherein the second zinc oxide layer has a thickness between about 100 nm and about 140 nm.

42. The solar cell of claim 34, wherein the second zinc oxide material comprises n-type zinc oxide.

43. The solar cell of claim 1, wherein the substrate is one of flexible and non-flexible and is selected from the group consisting of an indium tin oxide coated glass substrate, a copper substrate, a copper-coated substrate, a molybdenum coated substrate, a Poly(3,4-ethylenedioxythiophene) poly (styrene sulfonate) coated substrate, glass, paper, plastic, and textile.

44. The solar cell of claim 1, further comprising:
the second optional deposit layer deposited between the first layer and the second layer, the second optional deposit layer comprising poly-allylamine hydrochloride.

45. The solar cell of claim 44, wherein the second copper-based material is combined with poly-(sodium-4-styrene sulfonate) to facilitate deposition of the second copper-based material on the second optional deposit layer.

46. The solar cell of claim 45, wherein additional alternating deposits of poly-allylamine hydrochloride and additional layers of one or more of the first copper-based material or the second copper-based material are deposited above the second layer.

47. The solar cell of claim 1, wherein the first copper material is combined with PSS, and wherein the second copper material is first combined with PSS and later combined with PAH.

48. The solar cell of claim 47, wherein additional alternating layers of the first copper material and the second copper material are deposited above the second layer.

49. The solar cell of claim 1, wherein the substrate is selected from the group consisting of a planar substrate, a non-planar substrate, and a nano-planar substrate.

50. The solar cell of claim 1, wherein the first copper-based material is combined with PSS in an aqueous solution to facilitate deposition of the first copper-based material on the substrate.

51. The solar cell of claim 50, wherein the second copper-based material is combined with PAH in an aqueous solution to facilitate deposition of the second copper-based material on the first layer.

52. The solar cell of claim 1, wherein the substrate comprises a layer of poly(3,4-ethylenedioxythiophene) thereon.

53. The solar cell of claim 1, wherein the solar cell comprises the first optional deposit layer, the first optional deposit layer comprising poly(3,4-ethylenedioxythiophene).

54. The solar cell of claim 53, wherein the first copper-based material and the second copper-based material each comprise CIGS.

55. The solar cell of claim 54, wherein the first copper-based material is dispersed in one or both of isopropyl alcohol and an aqueous solution.

56. The solar cell of claim 54, further comprising:
a second substrate comprising a layer of a zinc material deposited thereon, the second substrate positioned upon an uppermost layer of either the first copper-based material or the second copper-based material.

57. The solar cell of claim 1, wherein the solar cell comprises the first optional deposit layer, the first optional deposit layer comprising indium tin dioxide.

58. The solar cell of claim 57, wherein the first copper-based material comprises CdS and wherein the second copper-based material comprises CIGS.

59. The solar cell of claim 58, further comprising:
a second substrate, wherein the second substrate comprises the second layer deposited thereon, and wherein the second substrate comprising the second layer is positioned upon the first layer.

60. The solar cell of claim 59, wherein the second substrate comprises a layer of indium tin dioxide thereon, and wherein the layer of indium tin dioxide is present upon the second substrate prior to the second layer being deposited thereon.

61. The solar cell of claim 1, wherein the first copper-based material is different from the second copper-based material.

* * * * *